United States Patent
Matamis et al.

(10) Patent No.: US 9,437,813 B2
(45) Date of Patent: *Sep. 6, 2016

(54) METHOD FOR FORMING RESISTANCE-SWITCHING MEMORY CELL WITH MULTIPLE ELECTRODES USING NANO-PARTICLE HARD MASK

(71) Applicant: SanDisk 3D LLC, Milpitas, CA (US)

(72) Inventors: George Matamis, San Jose, CA (US); James K Kai, Santa Clara, CA (US); Vinod R Purayath, Santa Clara, CA (US); Yuan Zhang, San Jose, CA (US); Henry Chien, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 194 days.

This patent is subject to a terminal disclaimer.

(21) Appl. No.: 13/767,649

(22) Filed: Feb. 14, 2013

(65) Prior Publication Data
US 2014/0227853 A1    Aug. 14, 2014

(51) Int. Cl.
*H01L 47/00* (2006.01)
*H01L 45/00* (2006.01)
*H01L 27/24* (2006.01)

(52) U.S. Cl.
CPC .......... *H01L 45/04* (2013.01); *H01L 27/2463* (2013.01); *H01L 27/2481* (2013.01); *H01L 45/06* (2013.01); *H01L 45/1233* (2013.01); *H01L 45/1273* (2013.01); *H01L 45/144* (2013.01); *H01L 45/145* (2013.01); *H01L 45/146* (2013.01); *H01L 45/147* (2013.01); *H01L 45/149* (2013.01); *H01L 45/16* (2013.01); *H01L 45/1675* (2013.01)

(58) Field of Classification Search
CPC combination set(s) only.
See application file for complete search history.

(56) References Cited

U.S. PATENT DOCUMENTS

| | | |
|---|---|---|
| 6,316,799 B1 | 11/2001 | Kunikiyo |
| 7,501,315 B2 | 3/2009 | Heald et al. |
| 7,851,777 B2 | 12/2010 | Arai et al. |
| 7,993,539 B2 | 8/2011 | Marsh |
| 8,080,443 B2 | 12/2011 | Chen et al. |
| 2002/0079483 A1 | 6/2002 | Dennison |
| 2005/0260839 A1 | 11/2005 | Allenspach et al. |

(Continued)

OTHER PUBLICATIONS

Haupt, M., et al., "Semiconductor nanostructures defined with self-organizing polymers," Journal of Applied Physics, vol. 91, No. 9, May 1, 2002, 3 pages.

(Continued)

*Primary Examiner* — Ali Naraghi
(74) *Attorney, Agent, or Firm* — Vierra Magen Marcus LLP

(57) ABSTRACT

In a fabrication process for reversible resistance-switching memory cells, a bottom electrode layer is coated with nano-particles. The nano-particles are used to etch the bottom electrode layer, forming multiple narrow, spaced apart bottom electrode structures for each memory cell. A resistance-switching material is then deposited between and above the bottom electrode structures, followed by a top electrode layer. Or, insulation is deposited between and above the bottom electrode structures, followed by planarizing and a wet etch to expose top surfaces of the bottom electrode structures, then deposition of the resistance-switching material and the top electrode layer. When the resistance state of the memory cell is switched, there is a smaller area in the bottom electrode for a current path, so the switching resistance is higher and the switching current is lower.

20 Claims, 14 Drawing Sheets

(56) References Cited

U.S. PATENT DOCUMENTS

| | | |
|---|---|---|
| 2006/0050561 A1 | 3/2006 | Guterman et al. |
| 2007/0166980 A1 | 7/2007 | Lee et al. |
| 2008/0246076 A1 | 10/2008 | Chen |
| 2010/0051896 A1 | 3/2010 | Park et al. |
| 2010/0078696 A1 | 4/2010 | Kim |
| 2010/0144135 A1 | 6/2010 | Kwon et al. |
| 2011/0073829 A1 | 3/2011 | Park et al. |
| 2011/0143477 A1 | 6/2011 | Lee et al. |
| 2011/0186799 A1 | 8/2011 | Kai et al. |
| 2012/0060905 A1 | 3/2012 | Fogel et al. |
| 2012/0168707 A1* | 7/2012 | Li ............................ H01L 45/04 257/4 |
| 2013/0221315 A1 | 8/2013 | Wang et al. |
| 2013/0316512 A1* | 11/2013 | Gunawan et al. ............ 438/396 |
| 2014/0225057 A1* | 8/2014 | Matamis et al. .................. 257/5 |

OTHER PUBLICATIONS

Lewis, P.A., et al., "Silicon nanopillars formed with gold colloidal particle masking," J. Vac. Sci. Technol. B 16(6), Nov./Dec. 1998, 4 pages.

Liang, Jiale, et al., "A 1.4uA Reset Current Phase Change Memory Cell with Integrated Carbon Nanotube Electrodes for Cross-Point Memory Application," Symposium on VLSI Technology Digest of Technical Papers, Apr. 2011, 2 pages.

Park, J., et al., "Quantized Conductive Filament Formed by Limited Cu Source in Sub-5nm Era," 2011 IEEE International Electron Devices Meeting, Dec. 2011, 4 pages.

Non-final Office Action dated Feb. 11, 2015, U.S. Appl. No. 13/767,663, filed Feb. 14, 2013.

Restriction Requirement dated Feb. 25, 2016, U.S. Appl. No. 14/807,370, filed Jul. 23, 2015.

U.S. Appl. No. 13/767,663, filed Feb. 14, 2013.

Response to Restriction Requirement dated Mar. 4, 2016, U.S. Appl. No. 14/807,370, filed Jul. 23, 2015.

Non-final Office Action dated Mar. 24, 2016, U.S. Appl. No. 14/807,370, filed Jul. 23, 2015.

Response to non-final Office Action dated May 6, 2015, U.S. Appl. No. 13/767,663, filed Feb. 14, 2013.

Notice of Allowance dated Jun. 23, 2015, U.S. Appl. No. 13/767,663, filed Feb. 14, 2013.

U.S. Appl. No. 14/807,370, filed Jul. 23, 2015.

Restriction Requirement dated Aug. 11, 2014, U.S. Appl. No. 13/767,663, filed Feb. 14, 2013.

Response to Restriction Requirement dated Sep. 9, 2014, U.S. Appl. No. 13/767,663, filed Feb. 14, 2013.

Response to Office Action dated Dec. 15, 2014, U.S. Appl. No. 13/767,663, filed Feb. 14, 2013.

Non-final Office Action dated Sep. 16, 2014, U.S. Appl. No. 13/767,663, filed Feb. 14, 2013.

Response to Office Action dated May 26, 2016, U.S. Appl. No. 14/807,370, filed Jul. 23, 2015.

\* cited by examiner

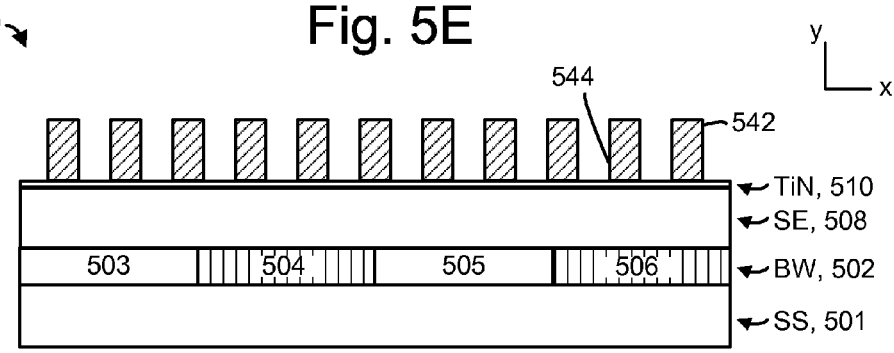
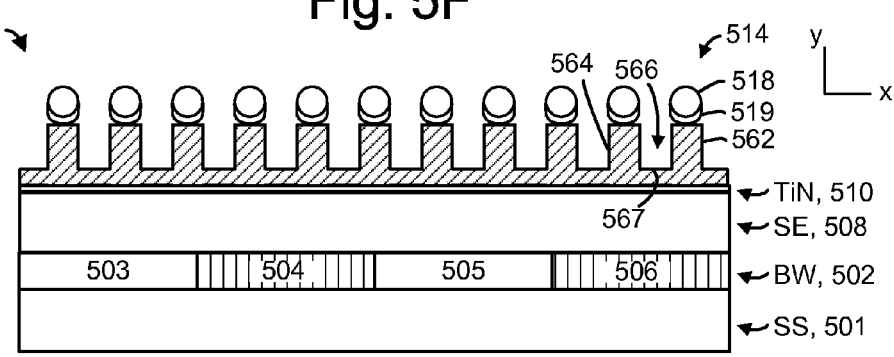
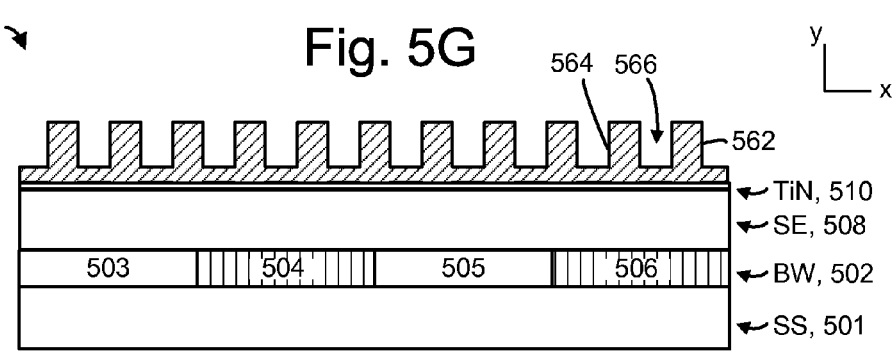

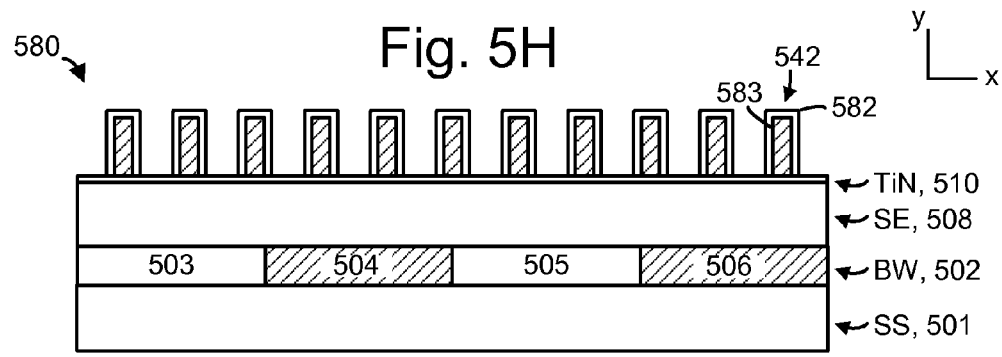
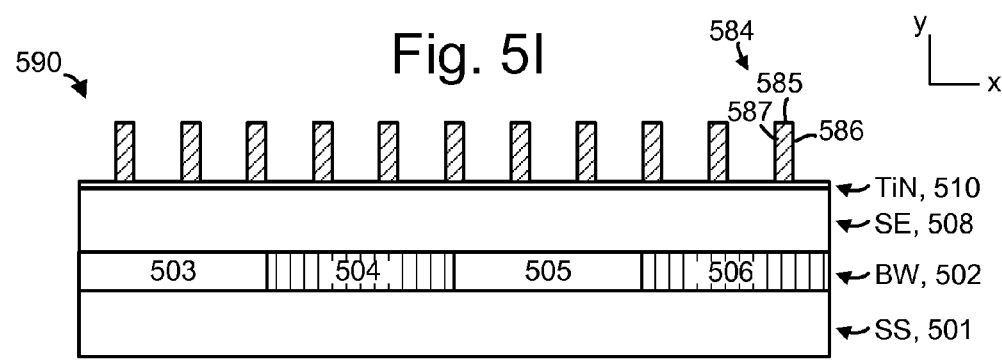
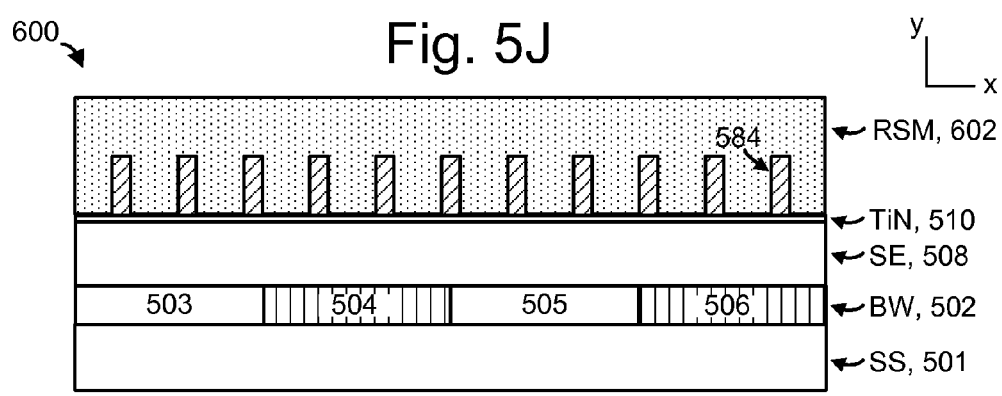

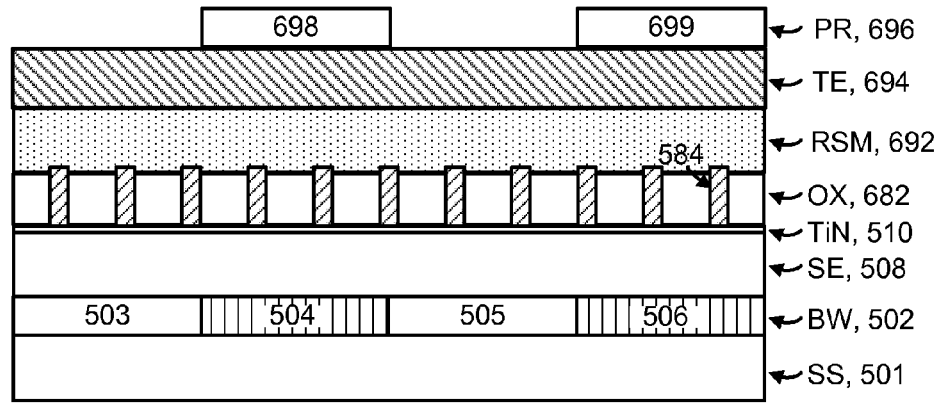
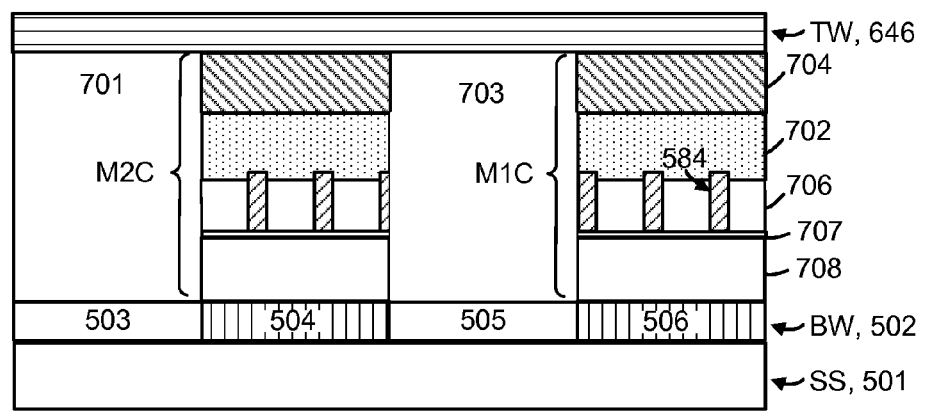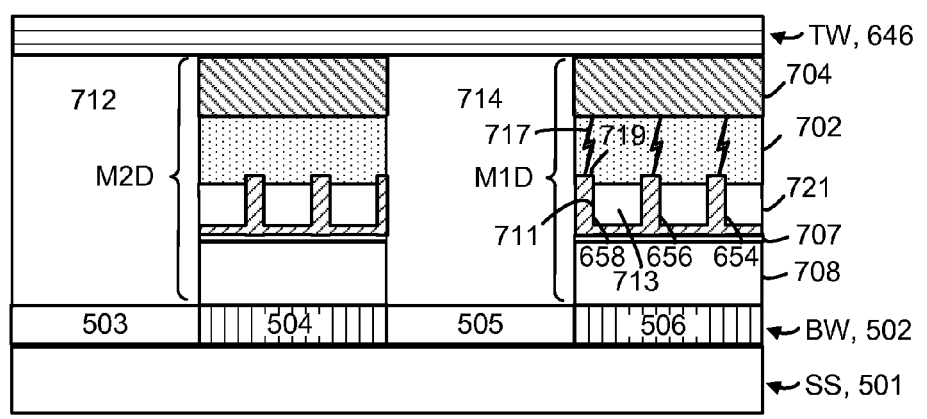

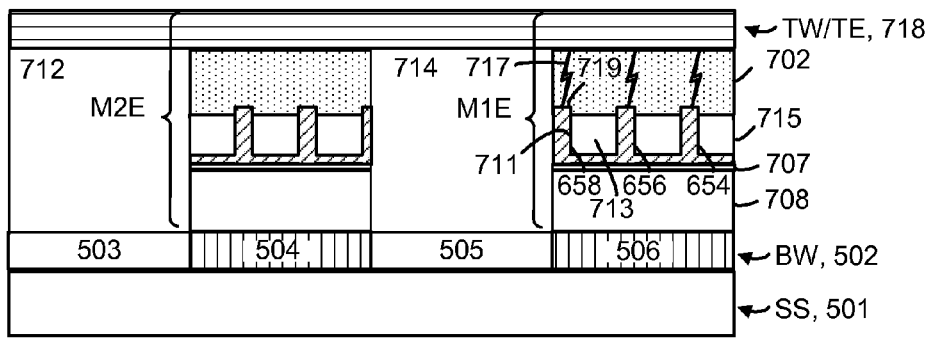
Fig. 5V
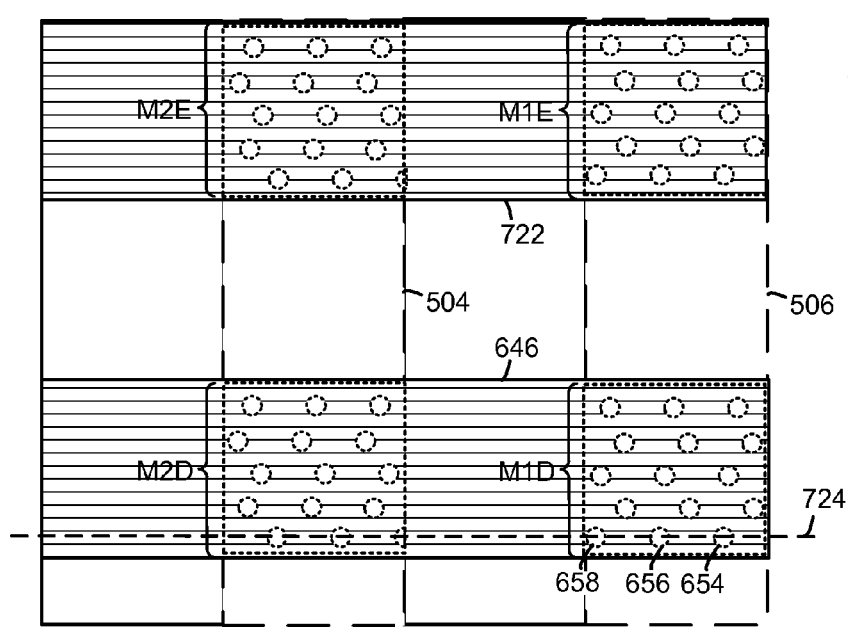
Fig. 5W
Fig. 5X
| Nano-particle diameter | Spacing | # nano-particles/ 576 nm² | Electrode area | Electrode area/ cell area |
|---|---|---|---|---|
| 2 nm | 2 nm | 36 | 113 nm² | 0.19 |
| 2 nm | 4 nm | 16 | 50 nm² | 0.09 |
| 2 nm | 6 nm | 9 | 28 nm² | 0.05 |
| 3 nm | 7 nm | 5.7 | 40 nm² | 0.07 |
| 3 nm | 9 nm | 4.0 | 28 nm² | 0.05 |

METHOD FOR FORMING RESISTANCE-SWITCHING MEMORY CELL WITH MULTIPLE ELECTRODES USING NANO-PARTICLE HARD MASK

CROSS-REFERENCE TO RELATED APPLICATIONS

This application is related to commonly-assigned U.S. patent application Ser. No. 13/767,663, filed herewith on Feb. 14, 2013, published as US 2014/0225057 on Aug. 14, 2014 and issued as U.S. Pat. No. 9,123,890 on Sep. 1, 2015, titled "Resistance-Switching Memory Cell With Multiple Electrodes,", incorporated herein by reference.

BACKGROUND

The present technology relates to data storage.

A variety of materials show reversible resistance-change or resistance-switching behavior in which the resistance of the material is a function of the history of the current through, and/or voltage across, the material. These materials include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN).

A resistance-switching element comprising one of these materials may be formed in an initial state, for example, a relatively low-resistance state. Upon application of sufficient voltage, the material switches to a stable high-resistance state which is maintained even after the voltage is removed. This resistance switching is reversible such that subsequent application of an appropriate current or voltage can serve to return the resistance-switching element to a stable low-resistance state which is maintained even after the voltage or current is removed. This conversion can be repeated many times. For some materials, the initial state is high-resistance rather than low-resistance. A set process may refer to switching the material from high to low resistance, while a reset process may refer to switching the material from low to high resistance. A resistance-switching memory cell can include a resistance-switching element positioned between first and second electrodes.

These reversible resistance-change materials are of interest for use in nonvolatile memory arrays. One resistance state may correspond to a data "0," for example, while the other resistance state corresponds to a data "1." Some of these materials may have more than two stable resistance states. Moreover, in a resistance-switching memory cell, the resistance-switching element can be in series with a steering element such as a diode or transistor, which selectively limits the voltage across, and/or the current flow through, the resistance-switching element. For example, a diode can allow current to flow in only one direction of the resistance-switching element while essentially preventing a current flow in the opposite direction. Such a steering element itself is not typically a resistance-change material. Instead, the steering element allows a resistance-switching memory cell to be written to, and/or read from, without affecting the state of other memory cells in an array.

However, there is a continuing need for technologies which allow memory cells to be scaled down in size.

DETAILED DESCRIPTION

Techniques are provided for forming reversible resistance-switching memory cells where each cell comprises one or more electrodes formed using nanoparticles as a hard mask. Reduced switching current is desirable in a resistance-switching memory cell since it reduces the power consumption of the associated memory device and the required size of the components. The endurance of the device can also be improved. However, the ability to define ever-smaller structures using existing lithographic techniques is a challenge. Techniques described herein use nano-particles to etch relatively narrow electrode structures or pillars which can reduce switching current, e.g., the current used to accomplish a set or reset in the resistance-switching material of the memory cell. The electrode structures can be made of conductive polysilicon, for instance In one approach, the techniques provided herein can form multiple sub-3 nm electrodes within one memory cell to reduce operation current to the 1-3 μA level for 3D ReRAM and PCM memory.

The reduced switching current is a result of a reduced contact area between the electrode structures and the resistance-switching material, where the electrode structures provide a limited number of conduction paths in the memory cell. Since there is a smaller area for a current path, the resistance is higher and the current is lower. Techniques provided herein can be used to control the number of conduction paths. A conduction path will be formed where a nano particle defines an electrode. In contrast, a continuous layer of electrode material can result in many conduction paths and therefore a high switching current.

Generally, the size of the electrode structures is the about same as the size of the nano-particles. Moreover, in one option, the size of the electrode structures can be made smaller by forming an oxide layer on the sides of the electrode structures and then removing the oxide layer. The number of electrode structures in a memory cell depends on the size of the nano-particle (core) and the ligand thickness, if applicable. By controlling the size of the nano-particle and the ligand thickness, the size of the electrode structures and the number of electrode structures in a memory cell can be controlled. The resolution of the lithography tools is therefore not a limitation. It would be difficult or impossible with current lithography tools to provide electrode structures, such as sub-3 nm electrode structures, which can be provided by using nano-particles as a hard mask. The process cost is relatively low because this method requires reduced lithography steps. The smaller the technology node, the fewer the number of electrode structures per cell. By defining electrodes using nanoparticles, with a smaller technology node, there are fewer nanoparticles and thus fewer conduction paths.

Figure 1:
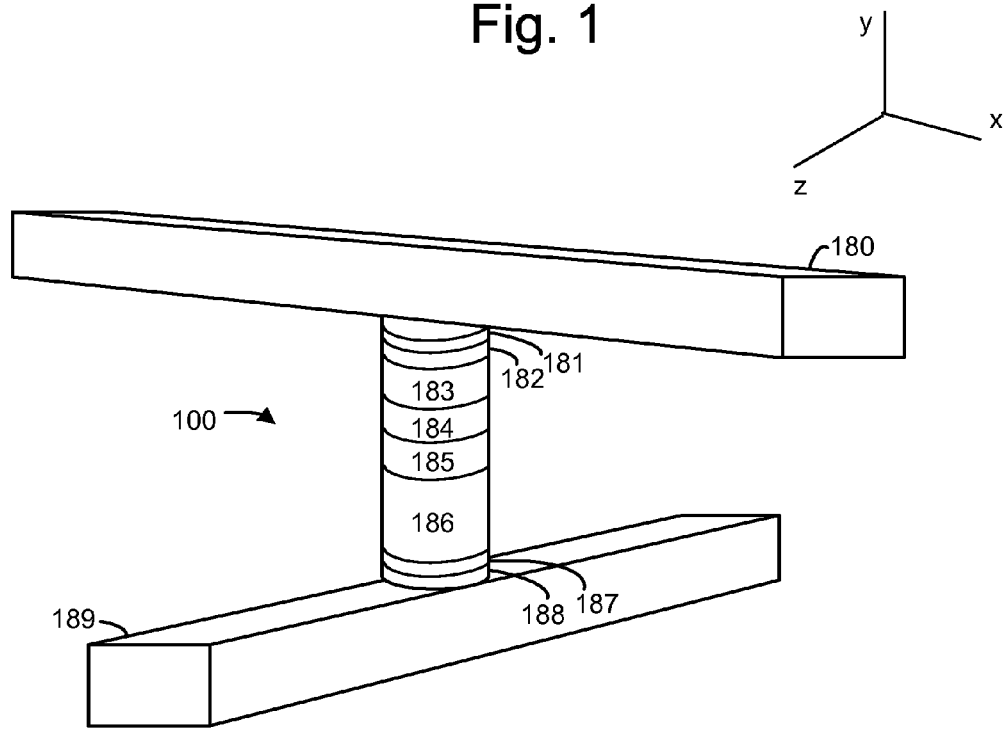
FIG. 1 is a simplified perspective view of one embodiment of a resistance-switching memory cell which includes a resistance-switching element in series with a steering element.

FIG. 1 is a simplified perspective view of one embodiment of a resistance-switching memory cell 100 which includes a resistance-switching element 184 in series with a steering element 186 between a first conductor 189 (e.g., a bit line) and a second conductor 180 (e.g., a word line). A top electrode 183 and a bottom electrode 185 are provided on either side of the resistance-switching element 184. An adhesion layer 182 (e.g., TiN) and a bit line contact (e.g., W or NiSi) layer 181 may also be provided. Below the steering element 186, an adhesion layer 187 and a word line contact layer 188 may be provided. As mentioned, a resistance-switching element has a resistance that may be reversibly switched between two or more states. For example, a resistance-switching element may be in an initial high-resistance (high resistance) state upon fabrication that is switchable to a low-resistance state upon application of a first voltage and/or current. Application of a second voltage and/or current may return the resistance-switching element to the high-resistance state. Alternatively, the resistance-switching element may be in an initial low-resistance state upon fabrication that is reversibly switchable to a high-resistance state upon application of the appropriate voltage(s) and/or current(s). When used in a resistance-switching memory cell, one resistance state may represent a binary "0" while another resistance state may represent a binary "1" of the resistance-switching element. However, more than two data/resistance states may be used in some cases.

In one embodiment, the process of switching the resistance-switching element from the high-resistance state to the low-resistance state is referred to as setting or forming, and the process of switching the resistance-switching element from the low-resistance state to the high-resistance state is referred to as resetting. The set or reset process can be performed for a resistance-switching memory cell to program it to a desired state to represent binary data.

In one approach, the bottom electrodes are made of conductive polysilicon or other material which can be etched by a nano-particle layer, as described further below. The top electrodes can be made of a metal such as titanium (Ti) or titanium nitride (TiN), for instance. Steering element 186 can be a diode, transistor (e.g., bipolar or CMOS) or other suitable steering element that exhibits non-ohmic conduction by selectively limiting the voltage across and/or the current flow through the resistance-switching element 184. In one approach, the steering element allows current to flow through the resistance-switching element in only one direction, e.g., from the bit line to the word line. In another approach, a steering element such as a punch-through diode allows current to flow through the resistance-switching element in either direction.

The steering element acts as a one-way valve, conducting current more easily in one direction than in the other. Below a critical "turn-on" voltage in the forward direction, the diode conducts little or no current. By use of appropriate biasing schemes, when an individual resistance-switching element is selected for programming, the diodes of neighboring resistance-switching elements can serve to electrically isolate the neighboring resistance-switching elements and thus prevent inadvertent resistance switching, so long as the voltage across the neighboring resistance-switching elements does not exceed the turn-on voltage of the diode when applied in the forward direction, or the reverse breakdown voltage when applied in the reverse direction.

Specifically, in a large cross-point array of resistance-switching elements, when relatively large voltage or current is required, there is a danger that resistance-switching elements that share the top or the bottom conductor with the resistance-switching element to be addressed will be exposed to sufficient voltage or current to cause undesired resistance switching. Depending on the biasing scheme used, excessive leakage current across unselected cells may also be a concern. The use of a diode or other steering element can overcome this danger.

In this manner, the memory cell 100 may be used as part of a two- or three-dimensional memory array and data may be written to and/or read from the memory cell 100 without affecting the state of other memory cells in the array. Steering element 186 may include any suitable diode such as a vertical polycrystalline p-n or p-i-n diode, whether upward pointing with an n-region above a p-region of the diode or downward pointing with a p-region above an n-region of the diode. Or, a punch-through diode or a Zener diode, which are operable in both directions, can be used. In one approach, the resistance-switching memory cell can be in the shape of a vertical pillar. In this case, the resistance-switching elements of each memory cell are separated from one another. In another option, the resistance-switching elements extend in linear, spaced-apart paths across multiple memory cells.

In some embodiments, steering element 186 may be formed from a polycrystalline semiconductor material such as polysilicon, a polycrystalline silicon-germanium alloy, polygermanium or any other suitable material. For example, the steering element 186 may include a heavily doped n+ polysilicon region, a lightly doped or an intrinsic (unintentionally doped) polysilicon region above the n+ polysilicon region, and a heavily doped p+ polysilicon region above the intrinsic region. It will be understood that the locations of the n+ and p+ regions may be reversed.

When steering element 186 is fabricated from deposited silicon (e.g., amorphous or polycrystalline), a silicide layer may be formed on the diode to place the deposited silicon in a low resistance state, as fabricated. Such a low resistance state allows for easier programming of the memory cell as a large voltage is not required to switch the deposited silicon to a low resistance state.

Conductors 189 and 180 include any suitable conductive material such as tungsten, any appropriate metal, heavily doped semiconductor material, a conductive silicide, a conductive silicide-germanide, a conductive germanide, or the like. In the embodiment of FIG. 1, conductors 189 and 180 are rail-shaped and extend in different directions (e.g., substantially perpendicular to one another). The conductors 189 may be part of a bottom wiring layer and the conductors 180 may be part of a top wiring layer. Other conductor shapes and/or configurations may be used. In some embodiments, barrier layers, adhesion layers, antireflection coatings and/or the like may be used with conductors 189 and 180 to improve device performance and/or aid in device fabrication. The conductor 180 extends in an x direction, the conductor 189 extends in a z direction, and the memory cell extends vertically in a y directional, in a Cartesian coordinate system.

While the resistance-switching element 184 is shown as being positioned above the steering element 186 in FIG. 1, it will be understood that in alternative embodiments, the resistance-switching element 184 may be positioned below the steering element 186. Various other configurations are possible as well. A resistance-switching element can exhibit unipolar or bipolar resistance-switching characteristics. With a unipolar resistance-switching characteristic, the voltages used for both set and reset processes are of the same polarity, i.e., either both positive or both negative. In contrast, with a bipolar resistance-switching characteristic, opposite polarity voltages are used for the set and reset processes. Specifically, the voltage used for the set process can be positive while the voltage used for the reset process is negative, or the voltage used for the set process can be negative while the voltage used for the reset process is positive.

Figure 2A:
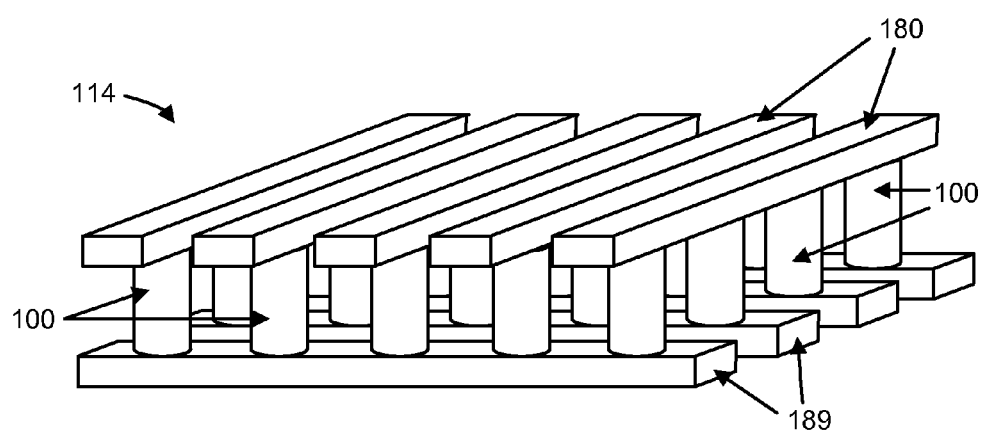
FIG. 2A is a simplified perspective view of a portion of a first memory level formed from a plurality of the memory cells of FIG. 1.

FIG. 2A is a simplified perspective view of a portion of a memory array 114 formed from a plurality of the memory cells 100 of FIG. 1. For simplicity, the resistance-switching element 184, the steering element 186, and other layers are not separately shown. The memory array 114 is a "crosspoint" array including a plurality of bit lines (second conductors 180) and word lines (first conductors 189) to which multiple memory cells are coupled (as shown). Other memory array configurations may be used, as may multiple levels of memory.

Figure 2B:
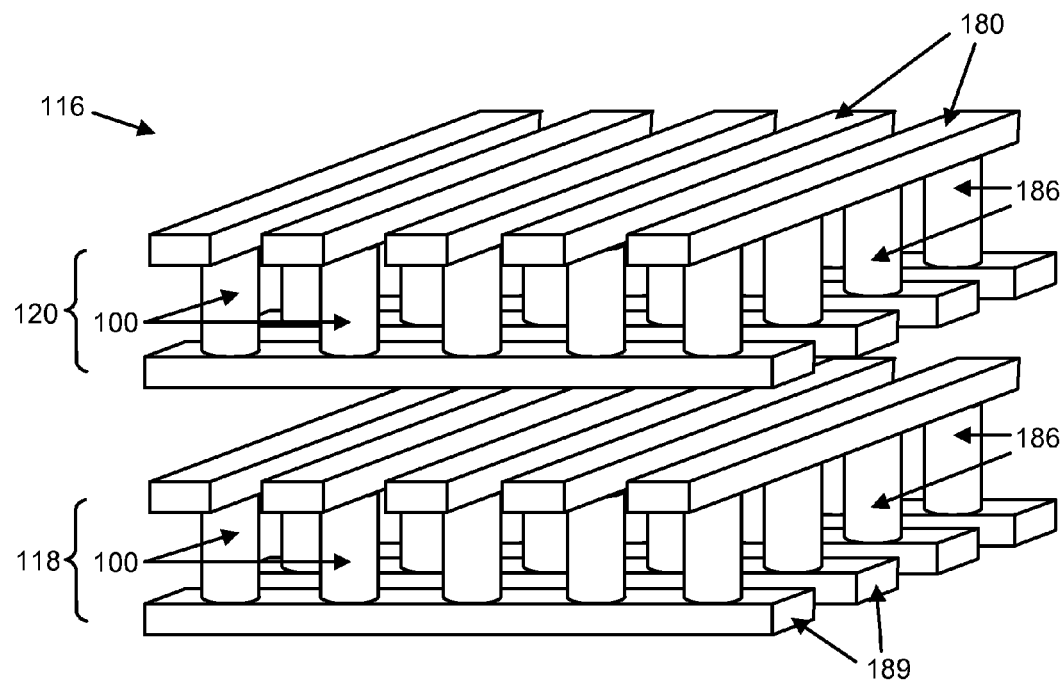
FIG. 2B is a simplified perspective view of a portion of a three-dimensional memory array formed from a plurality of the memory cells of FIG. 1.

FIG. 2B is a simplified perspective view of a portion of a monolithic three-dimensional array 116 that includes a first memory level 118 positioned below a second memory level 120. Each memory level 118 and 120 includes a plurality of memory cells 100 in a cross-point array. It will be understood that additional layers (e.g., an inter-level dielectric) may be present between the first and second memory levels 118 and 120, but are not shown for simplicity. Other memory array configurations may be used, as may additional levels of memory. In this embodiment, all diodes may "point" in the same direction, such as upward or downward depending on whether p-i-n diodes having a p-doped region on the bottom or top of the diode are employed, simplifying diode fabrication.

Figure 2C:
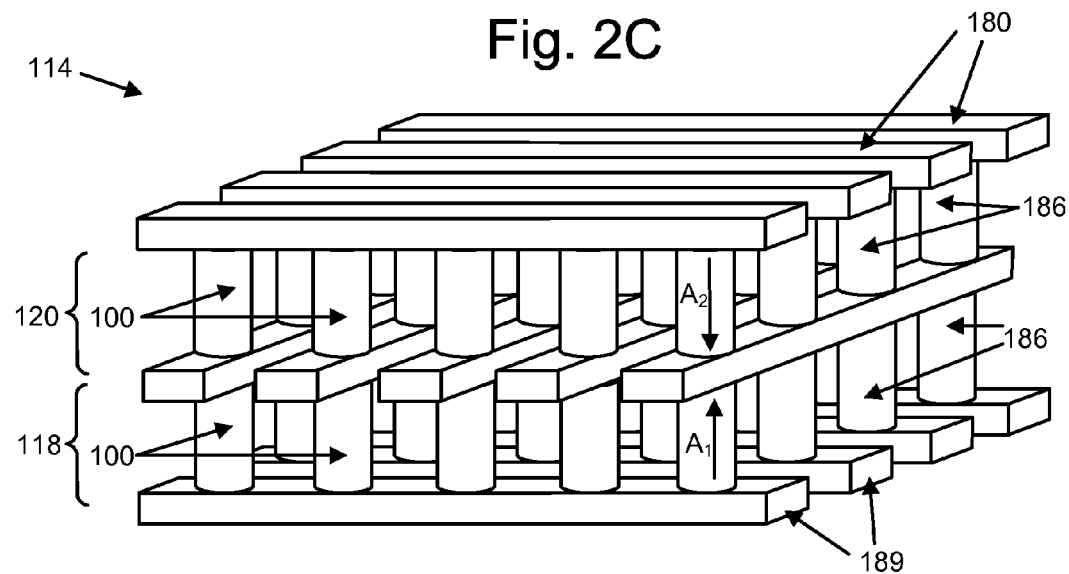
FIG. 2C is a simplified perspective view of a portion of a three-dimensional memory array formed from a plurality of the memory cells of FIG. 1, in which the upper conductors of a first memory level are used as the lower conductors of a second memory level.

FIG. 2C is a simplified perspective view of a portion of a three-dimensional memory array formed from a plurality of the memory cells of FIG. 1, in which the upper conductors of a first memory level may be used as the lower conductors of a second memory level. Here, the diodes on adjacent memory levels may point in opposite directions. For example, the diodes of the first memory level 118 may be upward pointing diodes as indicated by arrow A1 (e.g., with p regions at the bottom of the diodes), while the diodes of the second memory level 120 may be downward pointing diodes as indicated by arrow A2 (e.g., with n regions at the bottom of the diodes), or vice versa.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other. The substrates may be thinned or removed from the memory levels before bonding, but as the memory levels are initially formed over separate substrates, such memories are not true monolithic three-dimensional memory arrays.

The above examples show memory cells in a cylindrical pillar shape and conductors in the shapes of rails according to the disclosed arrangements. However, the technology described herein is not limited to any one specific structure for a resistance-switching memory cell. For example, a pillar shape using a rectangular (including square) cross-section is possible.

Figure 3:
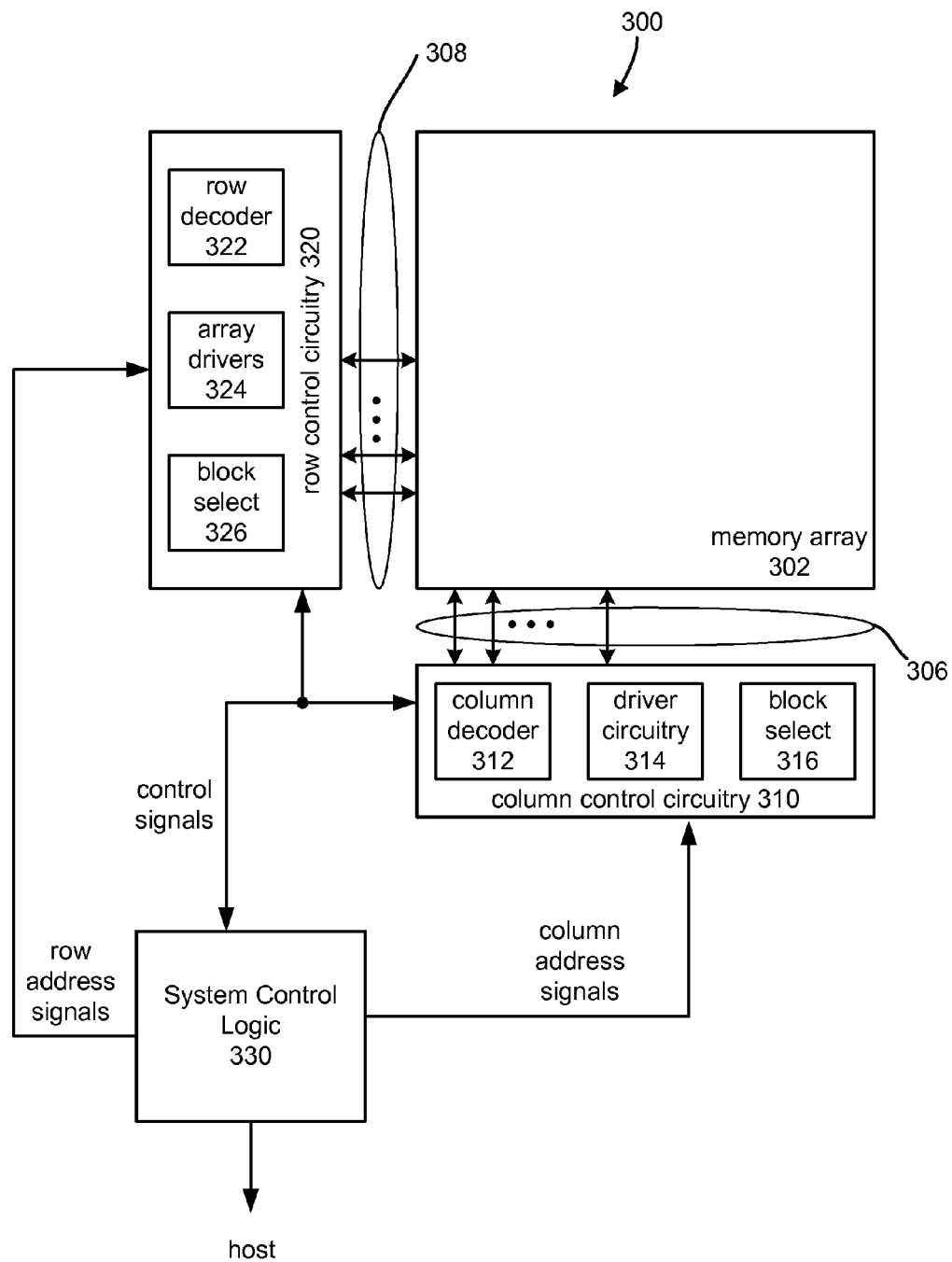
FIG. 3 is a block diagram of one embodiment of a memory system.

FIG. 3 is a block diagram that depicts one example of a memory system 300 that can implement the technology described herein. Memory system 300 includes a memory array 302 that can be a two- or three-dimensional array of memory cells as described above. In one embodiment, memory array 302 is a monolithic three-dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic 330 (a circuit), and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. Column control circuitry 310 receives a group of N column address signals and one or more various control signals from system control logic 330, and typically may include such circuits as column decoders 312, array terminal receivers or drivers 314, block select circuitry 316, as well as read/write circuitry, including sense amps and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300. For example, write circuitry 460, read circuitry (e.g., sense amp 466) and clamp control circuitry 464, discussed further below, may be provided.

In one embodiment, all of the components depicted in FIG. 3 are arranged on a single integrated circuit. For example, system control logic 330, column control circuitry 310 and row control circuitry 320 can be formed on the surface of a substrate and memory array 302 in a monolithic three-dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, the resistance-switching element 184 may be reversibly switched between two or more states. For example, the resistance-switching element may be in an initial, high-resistance state upon fabrication that is switchable to a low-resistance state upon application of a first voltage and/or current. Application of a second voltage and/or current may return the resistance-switching element to a high-resistance state. The memory system 300 can used with any resistance-switching element described herein.

Figure 4:
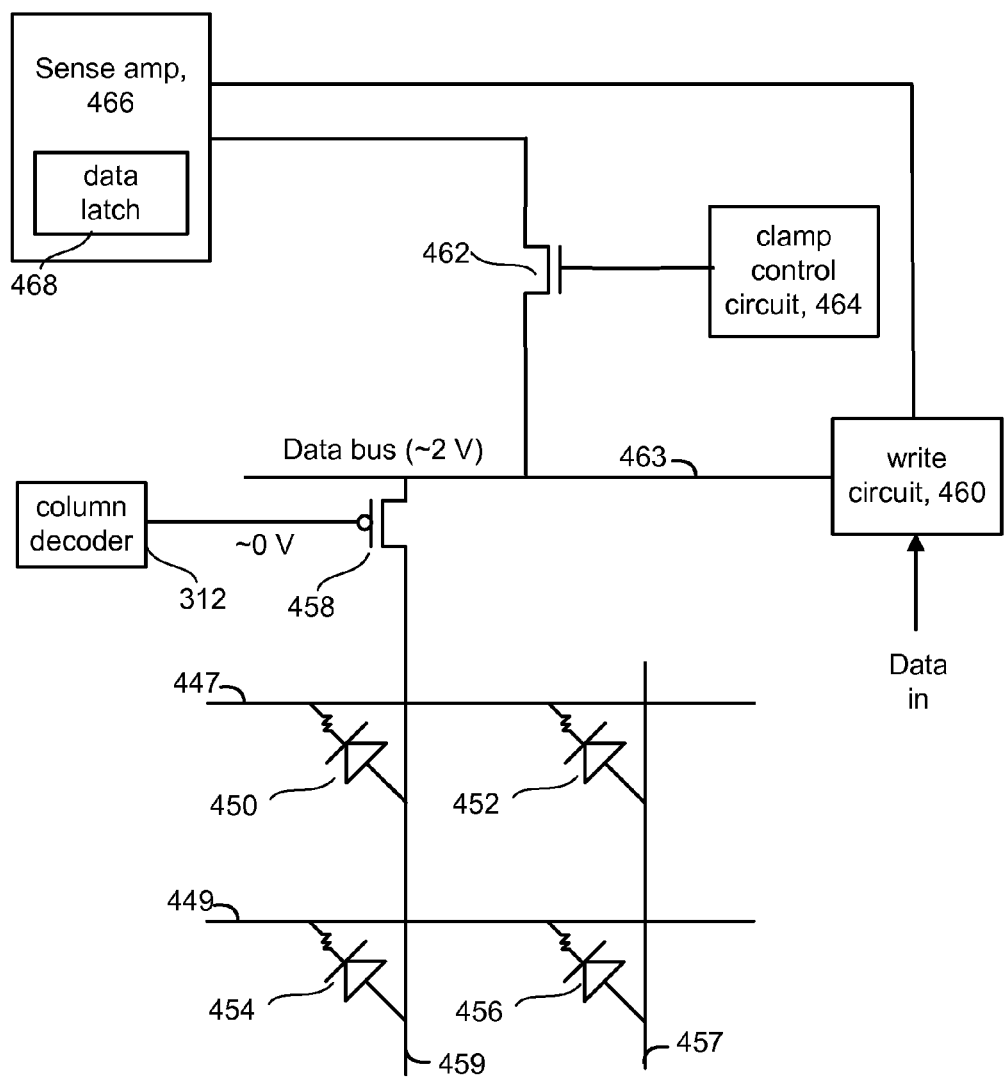
FIG. 4 depicts an embodiment of a circuit for reading the state of a resistance-switching memory cell.

FIG. 4 depicts an embodiment of a circuit for reading the state of a resistance-switching memory cell. A portion of a memory array includes memory cells 450, 452, 454 and 456. Two of the many bit lines and two of the many word lines are depicted. Bit line 459 is coupled to cells 450 and 454, and bit line 457 is coupled to cells 452 and 456. Bit line 459 is the selected bit line and may be at 2 V, for instance. Bit line 457 is an unselected bit line and may be at ground, for instance. Word line 447 is the selected word line and may be at 0 V, for instance. Word line 449 is an unselected word line and may be at 2 V, for instance.

A read circuit for one of the bit lines 459 is depicted to be connected to the bit line via transistor 458, which is controlled by a gate voltage supplied by column decoder 312 in order to select or unselect the corresponding bit line. Transistor 458 connects the bit line to a Data bus 463. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to a sense amp 466, which includes a data latch 468. The output of sense amp 466 is connected to a data out terminal (to system control logic 330, a controller and/or a host). Write circuit 460 is also connected to the sense amp 466 and the data latch 468.

When attempting to read the state of the resistance-switching element, all word lines are first biased at Vread (e.g., approximately 2 V) and all bit lines are at ground. The selected word line is then pulled to ground. For example, this discussion will assume that memory cell 450 is selected for reading. One or more selected bit lines 459 are pulled to Vread through the data bus (by turning on transistor 458) and the clamp device (transistor 462, which receives ~2 V+Vth, the threshold voltage of the transistor 462). The clamp device's gate is above Vread but controlled to keep the bit line near Vread. In one approach, current is pulled by the selected memory cell 450 through transistor 462 from a sense node in the sense amp. The sense node can receive a reference current that is between a high-resistance state current and a low-resistance state current. The sense node moves corresponding to the current difference between the cell current and the reference current. Sense amp 466 generates a data out signal by comparing the sensed voltage to a reference read voltage. If the memory cell current is larger than the reference current, the memory cell is in the low-resistance state and the voltage at the sense node will be lower than the reference voltage. If the memory cell current is smaller than the reference current, the memory cell is in the high-resistance state and the voltage at the sense node will be higher than the reference voltage. The output data signal from the sense amp 466 is latched in data latch 468.

Figure 5A:
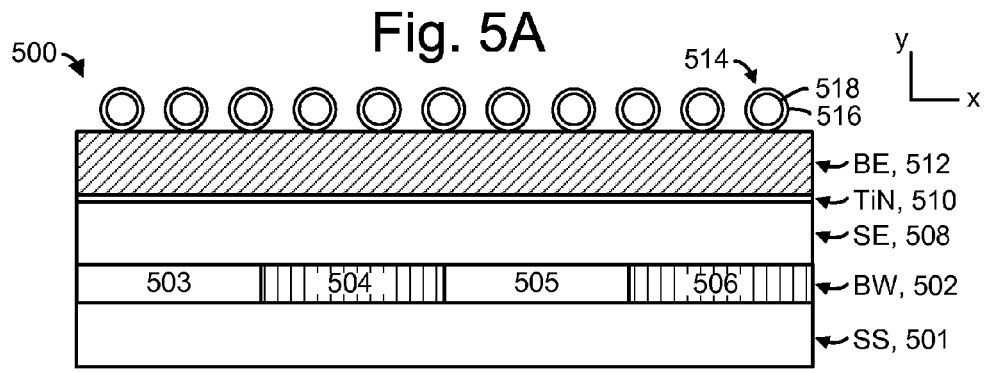
FIGS. 5A-5W depict cross-sectional views and top views of a layered semiconductor material in different stages of a fabrication process.

FIGS. 5A-5W depict cross-sectional views and top views of a layered semiconductor material in different stages of a fabrication process.

FIG. 5A depicts a cross-sectional view of a layered semiconductor material 500 which includes a substrate (SS) 501, a bottom wiring (BW) layer 502, a steering element (SE) layer 508, a TiN layer 510 (or other layer of adhesion material) and a bottom electrode (BE) layer 512. The bottom wiring layer 502 includes spaced apart, parallel bottom wires 504 and 506 extending in a z direction, and spaced apart, parallel insulating regions 503 and 505 extending in the z direction. See also FIG. 5W. A plurality of nano-particles are deposited on the bottom electrode layer, such as example nano-particle 514 comprising a core 518 and an optional coating 516 such as a ligand.

The layered semiconductor material may be on a wafer. The bottom wiring layer can include spaced-apart conductive (e.g., metal) rails such as word lines similar to the word line 189 in FIG. 1 which extend in a z direction, perpendicular to the page. The word lines are separated by the spaced-apart insulating regions. The steering element layer can include one or more layers which will form a respective diode for each memory cell, for instance. These can be similar to the steering element 186 in FIG. 1. The bottom electrode layer comprises a conductive material which will form a respective bottom electrode for each memory cell.

The nano-particles can be deposited to coat the bottom electrode layer. The nano-particles can be deposited directly on the bottom electrode layer or one or more intervening layers. For example, a spin on process can be used which allows the density and spacing of the nano-particles to be well controlled. By setting the concentration and spin-coating conditions, such as wafer rotation speed, a desired nano-particle density can be obtained. Example densities are discussed further below in connection with FIG. 5W. In one approach, the nano-particles are applied in a single layer. The nano-particles can be metal particles which are converted to metal oxide such as HfO2 by thermal processing of the wafer. A metal nano-particle is able to withstand an etching process.

In another approach, the nano-particles comprise carbon. In another approach, the nano-particles comprise colloidal dots, a pre-made dot that is dispersed on the wafer. The nano-particles may self-assemble so that they are uniformly spaced. The nano-particles may be coated in a ligand, where the ligand is converted to an oxide film by a thermal process.

The ligand coating increases the diameter of the nano-particles and can thereby assist in spacing the nano-particles uniformly. In an example implementation, the nano-particles have a diameter of about 3-5 nm or less, or about 2-9 nm. The nano-particles can be generally spherical, in the form of nano-dots, or otherwise shaped. In one approach, nano-particles with a diameter on the order of, e.g., 1 nm, are be used. This approach can form multiple sub-3 nm electrodes within one cell to reduce operation current to the 1-3 µA level for 3D ReRAM and PCM memory.

Generally, the bottom electrode layer (and the top electrode layer, discussed further below) can be formed of a conductive material which can comprise, e.g., tungsten, copper, aluminum, tantalum, titanium, cobalt, titanium nitride or alloys thereof, or conductive (doped) polysilicon. The bottom electrode layer is etched using the nano-particle as a hard mask and therefore is made of a material which is suitable for etching. The etching process is selective to the bottom electrode layer. In one approach, the bottom electrode layer comprises doped polysilicon with a doping concentration of, e.g., 1×10^18/cm^3 or higher which renders the polysilicon conductive so it can be effectively used as an electrode material, while also providing a material which is suitable for etching using the nano-particles. P-type or n-type doped silicon electrodes can be provided. An example implementation uses a 10 nm thick layer for the top and bottom electrodes.

Barrier and adhesion layers for the electrodes, such as TiN layers, may be included as well. For example, the TiN layer 510 serves as an adhesion layer for the bottom electrode layer.

Figure 5B:
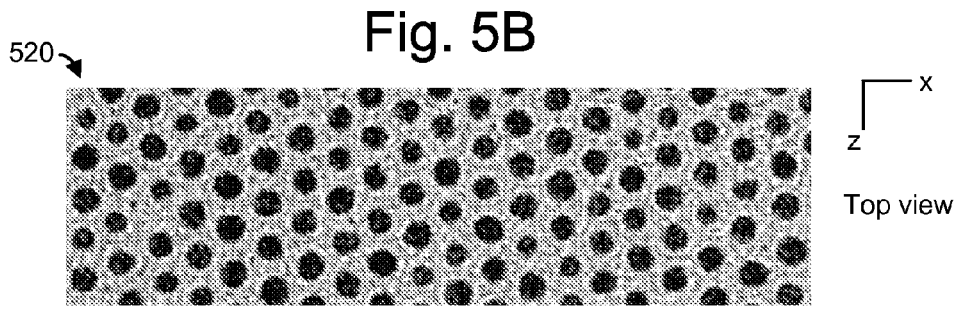
FIG. 5X is a table of example nano-particle diameters and spacings, and corresponding ratios of electrode area to cell area, for an example cell having an area of 576 nm^2 based on a half-pitch of 24 nm.

FIG. 5B depicts a representative image 520 of a top view of the layered semiconductor material 500 of FIG. 5A. The black areas represent the nano-particle cores and the white areas represent the coatings. The nano-particles can be essentially touching, in one approach.

Figure 5C:
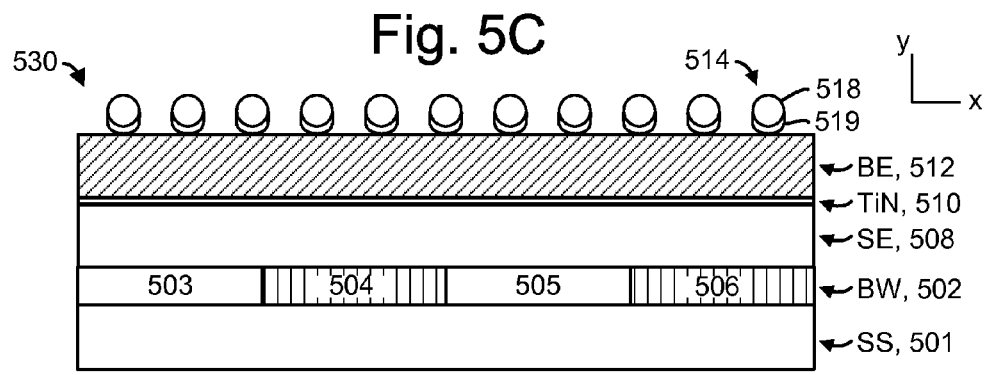

FIG. 5C depicts a layered semiconductor material 530 which is formed by etching the nano-particle coatings in the layered semiconductor material 510 of FIG. 5A. This optional etching can reduce the diameter of each nano-particle by removing a portion of the coating above and on the sides of each nano-particle, leaving a portion of the coating of each nano-particle below the core. The example nano-particle 514 includes the core 518 as depicted in FIG. 5A and a coating portion 519 under the core 518. This step can potentially result in narrower raised structures in the bottom electrode material. For example, the ligand may be an organic or oxide based material while the core is a metal dot (sphere) in which case carbon fluorine based chemistry can be used to etch the oxide portion but not the metal. Etching of the nano-particle coating is appropriate mainly when the there is some space between the ligands.

Figure 5D:
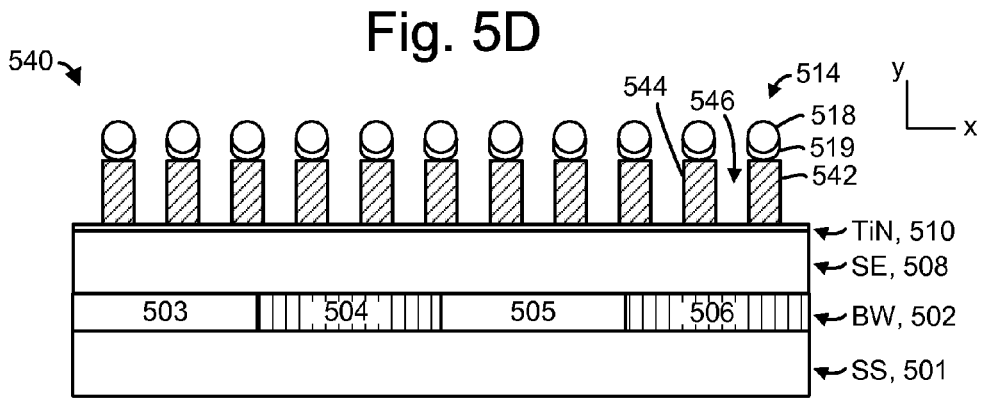

FIG. 5D depicts a layered semiconductor material 540 which is formed by etching the layered semiconductor material 530 of FIG. 5A using the nano-particles as a mask. For example, reactive ion etching which is selective to the bottom electrode material may be used. In this example, the unmasked portions of the bottom electrode layer are etched away until the TiN layer 510 is reached, so that the etching reaches completely through the bottom electrode layer. In another approach, depicted in FIG. 5F, the etching stops before the TiN layer 510 is reached so that the etching reaches partway but not completely through the bottom electrode layer. The etching of FIG. 5D results in forming a plurality of raised structures or pillars of the bottom electrode layer (such as example raised structures 542 and 544) with spaces (such as example space 546) between the structures. Note that the etching can result in the removal of the ligand, if present, and even part of the nano-particle core.

Generally, each electrode (raised structure) can be elongated and vertically extending and the different raised structures can be uniform. Alternatively, a rough surface which has distinct peaks on the bottom electrode layer can be formed.

FIG. 5E depicts a layered semiconductor material 550 which is formed by removing the nano-particles from the layered semiconductor material 540 of FIG. 5D. Different etching methods can be used such as RIE or wet chemistry methods. The top surfaces of the plurality of raised structures in the bottom electrode layer are thereby exposed. In this case, the plurality of raised structures are not joined to one another.

FIG. 5F depicts an alternative layered semiconductor material 560 which is formed by etching the layered semiconductor material 530 of FIG. 5A using the nano-particles as a mask. In this example, the etching of the unmasked portions of the bottom electrode layer stops before the TiN layer 510 is reached. This is considered to involve a partial etch of the bottom electrode layer rather than a full etch. The etching results in forming a plurality of raised structures in the bottom electrode layer (such as example raised structures 562 and 564) with spaces (such as example space 566) between the structures, and a joining portion between adjacent raised structures in the bottom electrode layer. For example, a joining portion 567 is between adjacent raised structures 562 and 564. The joining portion provides structural support for the serves to raised structures which may fall over if they are too tall. In this case, the plurality of raised structures are joined to one another at a bottom of the bottom electrode layer.

FIG. 5G depicts a layered semiconductor material 570 which is formed by removing the nano-particles from the layered semiconductor material 560 of FIG. 5F. The top surfaces of the plurality of raised structures in the bottom electrode layer, joined at the bottom, are thereby exposed.

FIG. 5H depicts a layered semiconductor material 560 which is formed by oxidizing the raised structures in the bottom electrode layer in the layered semiconductor material 550 of FIG. 5E. A similar process can be performed to oxidize the raised structures in the bottom electrode layer in the layered semiconductor material 570 of FIG. 5G. In FIG. 5H, an oxidized layer is formed on the top and side surfaces of each raised structure. For example, the example raised structures 542 includes an oxidized layer 582 and a remaining portion 583.

FIG. 5I depicts a layered semiconductor material 590 which is formed by removing the oxidized portions of the raised structures in the bottom electrode layer in the layered semiconductor material 580 of FIG. 5H. A chemistry can be used which removes the oxidized portions without attacking the bottom electrode material. As a result, the remaining portion (e.g., 583) is exposed as a slimmed or narrowed raised structure. Each raised structure such as raised structure 584 has a top surface 585 and side surfaces 586 and 587. Slimming is beneficial since it reduces the contact area for current flow in the memory cell. This is a contact area of the raised structures of the bottom to an overlying resistance switching material which is subsequently deposited. For example, assuming nano-particles with a 5 nm diameter are used, the width of the resulting raised structures is also about 5 nm. The oxide layer may be about 1 nm around each raised structures, so that the slimmed raised structure has a width of about 3 nm.

FIG. 5J depicts a layered semiconductor material 600 which is formed by depositing a resistance-switching material (RSM) 602 on the layered semiconductor material 590 of FIG. 5I. The RSM material will generally fill in spaces between the raised structures in the bottom electrode layer and form a layer above the raised structures in the bottom electrode layer. In this case, the resistance-switching material extends laterally adjacent to the one or more raised structures and above the one or more raised structures. The RSM can include any of the materials discussed previously. In an example implementation, the RSM comprises a metal oxide such as HfOx. In another example implementation, the RSM comprises a phase change material such as Germanium Antimony Tellurium (GbSbTe).

With the small spacing and density of the nano electrodes, the RSM layer will be relatively flat once a critical deposition thickness is reached. That is, spaces between the electrode will be filled and pinched off; thus, the top surface of the RSM layer will be essentially flat.

Figure 5K:
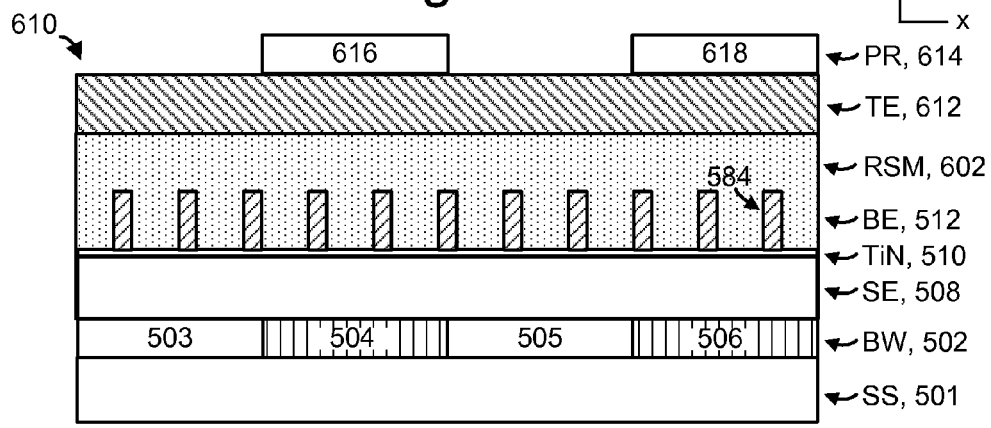

FIG. 5K depicts a layered semiconductor material 610 which is formed by depositing a top electrode material 612 on the layered semiconductor material 600 of FIG. 5J and forming a patterned photoresist layer 614 on the top electrode material 612. Memory cells can be formed in the layered semiconductor material by etching from the top electrode layer down through the steering element layer. In one approach, a photoresist or other type of mask is used to perform the etching. In one approach, the photoresist layer includes photoresist portions 616 and 618 which are above desired locations of the memory cells. For example, the photoresist portions can be square or round in a top view. The photoresist portions can be formed by a blanket deposition of photoresist, exposure of the photoresist through a mask and removal of the exposed or unexposed portions of the photoresist.

Figure 5L:
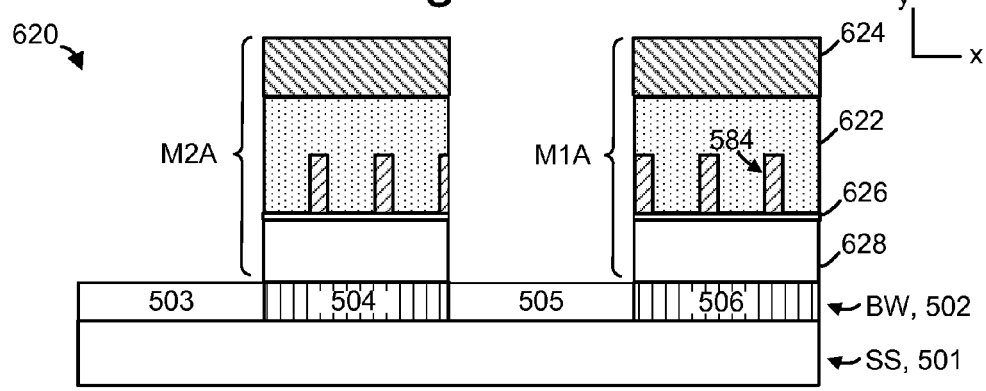

FIG. 5L depicts a layered semiconductor material 620 which is formed by etching the layered semiconductor material 610 of FIG. 5K using the photoresist portions 616 and 618, and subsequently removing photoresist portions, resulting in example memory cells M1A and M2A. Each memory cell such as example memory cell M1A includes a top electrode portion 624, a resistance-switching material portion 622, one or more raised structures 584 of a bottom electrode layer, a TiN layer portion 626 and a steering element portion 628. As a variation, the steering element could be above the resistance-switching material portion, between the resistance-switching material portion and the top electrode, instead of below it, between the resistance-switching material portion and the bottom electrode.

Figure 5M:
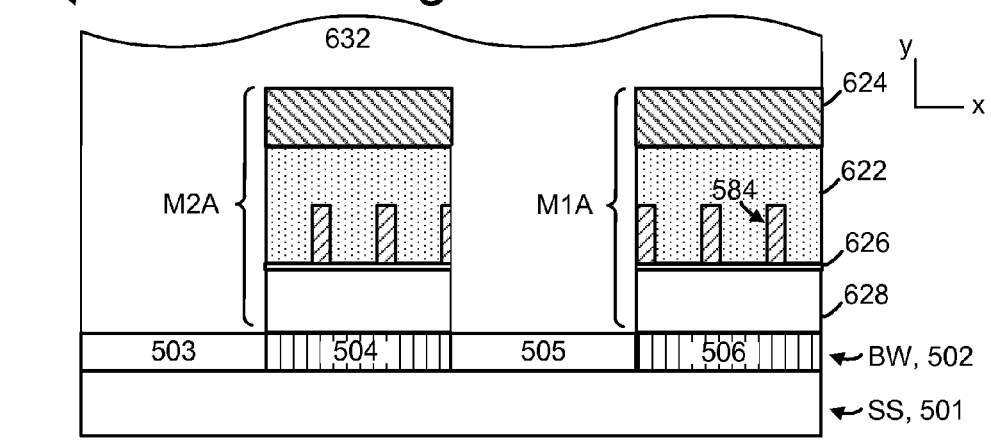

FIG. 5M depicts a layered semiconductor material 630 which is formed by depositing insulation 632 between and over the memory cells in the layered semiconductor material 620 of FIG. 5L. The insulation layer may be formed by any suitable methods, for example by physical vapor deposition, chemical vapor deposition or spin on technologies. The insulation layer can be formed by a low temperature and conformal deposition, for example an atomic layer deposition of a silicon oxide, flowable oxide deposition, or other suitable insulating materials. Another example is a flowable oxide available under the name Black-Diamond™ dielectric, available from Applied Materials, Santa Clara, Calif. Other flowable insulating materials include polymer materials, such as various polyimides, FLARE 2.0™ dielectric ((apoly(arylene)ether) available from Allied Signal, Advanced Microelectronic Materials, Sunnyvale, Calif.)

Figure 5N:
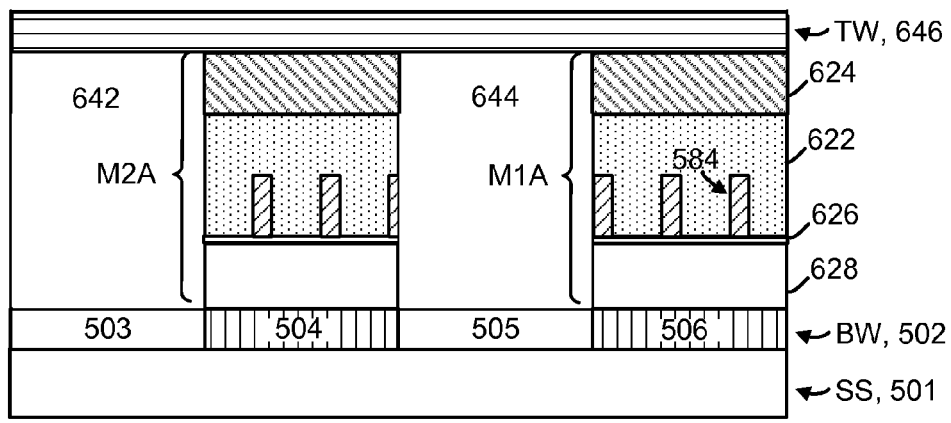

FIG. 5N depicts a layered semiconductor material 640 which is formed by planarizing the layered semiconductor material 630 of FIG. 5M and forming a top wiring layer comprising spaced apart, parallel wires such as wire 646. Once the material is planarized such as by using CMP, the top wires can be deposited using a subtractive etch or Damascene process, for instance. The top wires can run perpendicular to the bottom wires. See also FIG. 5W. Insulation portions 642 and 644 are also formed.

Figure 5O:
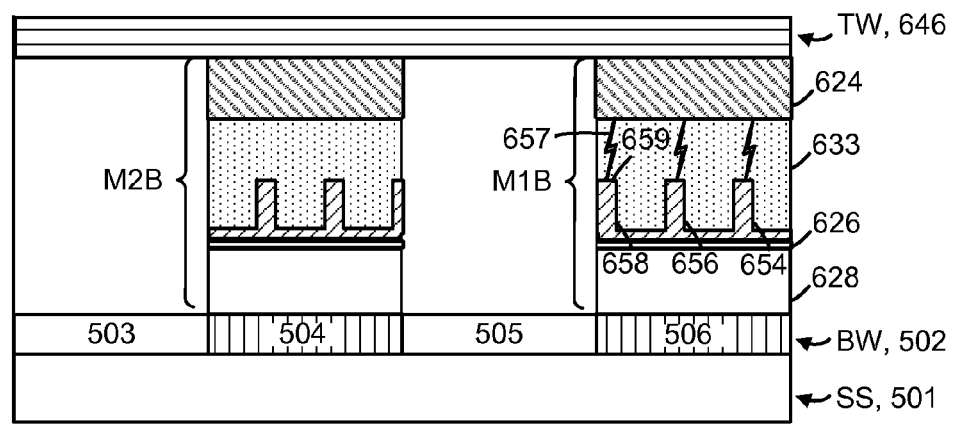

FIG. 5O depicts, as an alternative to FIG. 5N, a layered semiconductor material 650 where raised structures 654, 656 and 658 of the bottom electrode layer are joined at their bottom portions rather than being independent of one another as in FIG. 5N. This results in example memory cells M1B and M2B. Each memory cell such as example memory cell M1B includes the top electrode portion 624, a resistance-switching material portion 633, the one or more raised structures 654, 656 and 658 of the bottom electrode layer, the TiN layer portion 626 and the steering element portion 628. Each raised structure of the bottom electrode layer is an electrode, so that each memory cell can have multiple electrodes.

In this approach, in a switching operation, one or more conductive paths (depicted by lightning bolts) can extend from the top electrode portion 624 to the top surfaces of the raised structures 654, 656 and 658 of the bottom electrode layer. For example, a conductive path 657 can extend from the top electrode portion 624 to a top surface 659 of the raised structure 658 of the bottom electrode layer. The conductive path will seek the portion of the raised structure 658 (e.g., the top surface) which is closest to the top electrode portion 624, where the electric field is the highest. The conductive path will not seek the side portions of the raised structure even though they are also in contact with the resistance-switching material portion 633. These conductive paths can result in switching a state of the resistance-switching material portion and thereby changing the data state of the memory cell M1B.

The embodiments in which the resistance-switching material is deposited between the raised structures in the bottom electrode layer, in addition to being deposited above the raised structures in the bottom electrode layer, can be used when the resistance-switching material is initially in a high resistance state. In this case, a conductive path from the top electrode portion will seek out the top surface of a raised structure of the bottom electrodes because the structure has a lower resistance than the resistance-switching material. Switching from the high resistance state to the low resistance state will take place at the top surface of a raised structure so that the switching current is reduced. However, when the resistance-switching material is initially in a low resistance state, a conductive path from the top electrode portion will not seek out the top surface of the raised structure of the bottom electrodes, and switching from the low resistance state to the high resistance state will not take place at the top surface of the raised structure so that the switching current is not reduced. The embodiments of FIGS. 5P-5V resolve this issue by exposing the top surface to the resistance-switching material while little or none of the side surfaces of the raised structures in the bottom electrode layer is exposed to the resistance-switching material. This ensures that switching occurs at these top surfaces so that switching current is reduced regardless of whether the resistance-switching material is initially in a low or high resistance state.

Figure 5P:
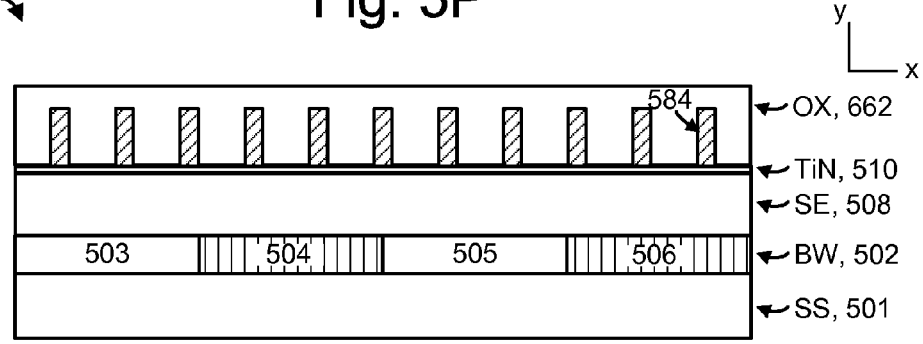

FIG. 5P depicts, as an alternative to FIG. 5J, a layered semiconductor material 660 where an insulating material such as oxide is deposited before a resistance-switching layer is deposited. Specifically, an oxide layer 662 can be deposited between and above the raised structures in the bottom electrode layer such as the example raised structure 584. Other insulating materials, e.g., SiN, SiON and silicon on glass (SOG) can be used as well.

Figure 5Q:
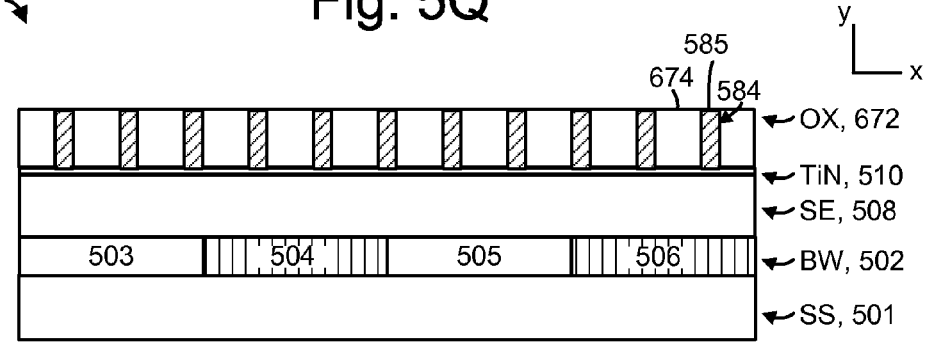

FIG. 5Q depicts a layered semiconductor material 670 which is obtained by planarizing the layered semiconductor material 660 of FIG. 5P. For example, chemical-mechanical polishing (CMP) can be used to planarize the oxide down to a level of the top surfaces of the raised structures in the bottom electrode layer such as the top surface 585 of the example raised structure 584. Portions 674 of the oxide layer 672 are thereby formed between the raised structures in the bottom electrode layer. However, even with the planarization, the top surfaces of the raised structures in the bottom electrode layer may still have some oxide on them which would interfere with their ability to provide a conductive path in the resistance-switching material. To remove any residual oxide on the top surfaces, a wet etch or a reactive ion etch (RIE) of the oxide can be performed as depicted in FIG. 5R.

Figure 5R:
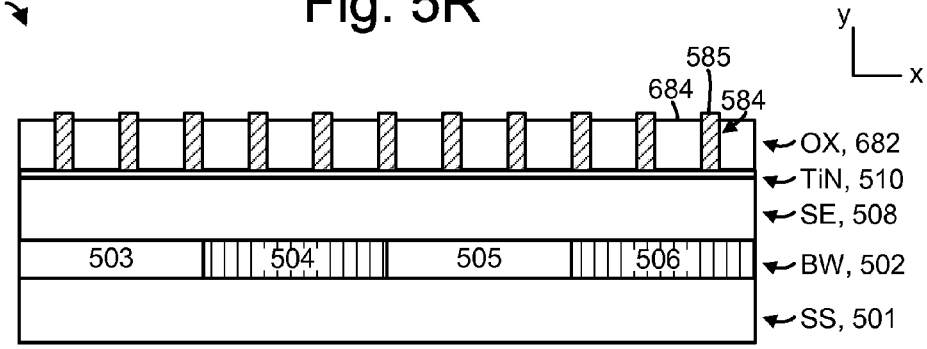

FIG. 5R depicts a layered semiconductor material 680 which is obtained by performing a wet etch of the layered semiconductor material 670 of FIG. 5Q. As a result, the portions 684 of the oxide layer 682 are clearly recessed below the top surfaces of the raised structures in the bottom electrode layer so that residual oxide on the top surfaces is removed.

FIG. 5S depicts a layered semiconductor material 690 which is formed by depositing a resistance-switching material (RSM) 692 on the layered semiconductor material 680 of FIG. 5R. The RSM material forms a layer above the raised structures in the bottom electrode layer and the portions of the oxide layer. A top electrode material 694 is deposited on the RSM 692. Photoresist portions 698 and 699 in a photoresist layer 696 are then formed on the top electrode material 694, to define the locations of the memory cells. In this case, the insulating material extends laterally adjacent to the one or more raised structures and the resistance-switching material extends above the one or more raised structures and the insulating material.

FIG. 5T depicts a layered semiconductor material 700 which is formed by etching the layered semiconductor material 690 of FIG. 5S using the photoresist portions 698 and 699, subsequently removing the photoresist portions, resulting in example memory cells M1C and M2C. The additional steps of depositing insulation, planarizing, and depositing top wires such as top wire 646 as discussed in connection with FIG. 5N, are also performed. Insulation portions 701 and 703 are formed. Each memory cell such as example memory cell M1C includes a top electrode portion 704, a resistance-switching material portion 702, one or more raised structures 584 of the bottom electrode layer, oxide portions 706, a TiN layer portion 707 and a steering element portion 708.

FIG. 5U depicts, as an alternative to FIG. 5T, a layered semiconductor material 710 where the raised structures 654, 656 and 658 of the bottom electrode layer are joined at their bottom portions rather than being independent of one another as in FIG. 5T. This results in example memory cells M1D and M2D. Each memory cell such as example memory cell M1D includes the top electrode portion 704, the resistance-switching material portion 702, the one or more raised structures 654, 656 and 658 of the bottom electrode layer, oxide portions 721, the TiN layer portion 707 and the steering element portion 708. Insulation portions 712 and 714 are also formed.

Similar to the depiction in FIG. 5O, in FIG. 5U, one or more conductive paths (depicted by lightning bolts) can extend from the top electrode portion 704 to the top surfaces of the raised structures 654, 656 and 658 of the bottom electrode layer. For example, the conductive path 717 can extend from the top electrode portion 704 to the top surface 719 of the raised structure 658 of the bottom electrode layer. The conductive path will seek the portion of the raised structure 658 (e.g., the top surface 659) which is closest to the top electrode portion 704. Further, the presence of the oxide at the sides of the raised structures in the bottom electrode layer (such as oxide portion 713 at the side 711 of the raised structure 658) prevents the conductive path from reaching the sides of the raised structures in the bottom electrode layer.

In this embodiment, each memory cell has a separate top electrode and a top wire or bit line contacts the top electrodes.

FIG. 5V depicts a layered semiconductor material 715 which is an alternative to the layered semiconductor material 710 of FIG. 5U. In this approach, the top wiring layer 718 also serves as the top electrode for the memory cells M1E and M2E. This approach can reduce the height of the memory device and the number of processing steps. In this embodiment, each cell does not have a separate top electrode. Instead, the top electrode is a portion of the top wire or bit line.

FIG. 5W depicts an example top view of a layered semiconductor material 720 such as based on the layered semiconductor materials of FIG. 5N, 5O, 5T, 5U or 5V. The top wire 646 of FIG. 5N, 5O, 5T or 5U is depicted, along with another top wire 722. Each top wire extends in the x-direction, and many top wires are parallel and spaced in the z-direction. The bottom wires 504 and 506 of the previous figures are also depicted. Each bottom wire extends in the z-direction, and many top wires are parallel and spaced apart in the z-direction. FIGS. 5O and 5U provide a cross-sectional view along line 724. Circular dashed lines depict locations of raised structures in the bottom electrode layer. For example, the representative raised structures 654, 656 and 658 of FIGS. 5O and 5U are depicted. The example memory cells M1D and M2D of FIG. 5U are depicted, in addition to two other example memory cells M1E and M2E. In this approach, the raised structures in the bottom electrode layer are provided within the memory cells but not outside the memory cells. In another possible approach, the raised structures in the bottom electrode layer could also be provided in regions outside the memory cells. These raised structures would have no effect on the memory device because they are not between top and bottom electrodes.

As mentioned, the memory cells can be formed as pillars with a generally rectangular or cylindrical shape. Further, each memory cell can have one or more raised structures of a bottom electrode layer. Typically, each memory cell can have multiple structures of a bottom electrode layer. Examples configurations are discussed next.

FIG. 5X is a table of example nano-particle diameters and spacings, and corresponding ratios of electrode area to cell area, for an example cell having an area of 576 nm^2 based on a half-pitch of 24 nm. The columns represent the nano-particle diameter (which is also the diameter of the raised structures in the bottom electrode layer), the spacing between nano-particles (which is also the spacing between the raised structures in the bottom electrode layer), the number of nano-particles per memory cell area (which is also the number of raised structures in the bottom electrode layer and is a density), the total electrode area (the combined area of the raised structures in the bottom electrode layer) per memory cell and the ratio of total electrode area to cell area. The nano-particle diameter can be the diameter of the core of a nano-particle, for example.

For example, the first entry is for a nano-particle diameter of 2 nm and a spacing of 2 nm. Assuming a cell cross-sectional area of 24 nm×24 nm, there are 24/(2+2)=6 nano-particles in a row and 6 rows of nano-particles for a total of 36 nano-particles. The area of each nano-particle or raised structure in the bottom electrode layer, assuming a circular cross section, is the area of a circle whose diameter is 2 nm, is $\pi(d/2)^2$. In the first entry, the area of each raised structure in the bottom electrode layer is $\pi(2/2)^2=\pi$. The total area of the raised structures in the bottom electrode layer in a cell is therefore 36×$\pi$=113. The ratio of the total area of the raised structures in the bottom electrode layer to the cell area is 113/576=0.19.

The second entry is for a nano-particle diameter of 2 nm and a spacing of 4 nm. There are 24/(2+4)=4 nano-particles in a row and 4 rows of nano-particles for a total of 16 nano-particles. The area of each raised structure in the bottom electrode layer is $\pi(2/2)^2=\pi$. The total area of the raised structures in the bottom electrode layer in a cell is therefore 16×$\pi$=50. The ratio of the total area of the raised structures in the bottom electrode layer to the cell area is 50/576=0.09.

The third entry is for a nano-particle diameter of 2 nm and a spacing of 6 nm. There are 24/(2+6)=3 nano-particles in a row and 3 rows of nano-particles for a total of 9 nano-particles. The area of each raised structure in the bottom electrode layer is $\pi(2/2)^2=\pi$. The total area of the raised structures in the bottom electrode layer in a cell is therefore 9×$\pi$=28. The ratio of the total area of the raised structures in the bottom electrode layer to the cell area is 28/576=0.05.

The fourth entry is for a nano-particle diameter of 3 nm and a spacing of 7 nm. There are 24/(3+7)=2.4 nano-particles in a row and 2.4 rows of nano-particles for a total of 5.7 nano-particles. The values provided are averages across multiple memory cells. The area of each raised structure in the bottom electrode layer is $\pi(3/2)^2=2.25\pi$. The total area of the raised structures in the bottom electrode layer in a cell is therefore 5.7×2.25×$\pi$=40. The ratio of the total area of the raised structures in the bottom electrode layer to the cell area is 40/576=0.07.

The fifth entry is for a nano-particle diameter of 3 nm and a spacing of 9 nm. There are 24/(3+9)=2 nano-particles in a row and 2 rows of nano-particles for a total of 4 nano-particles. The area of each raised structure in the bottom electrode layer is $\pi(3/2)^2=2.25\pi$. The total area of the raised structures in the bottom electrode layer in a cell is therefore 4×2.25×$\pi$=28. The ratio of the total area of the raised structures in the bottom electrode layer to the cell area is 28/576=0.05, the same as for the third entry.

In these examples, each raised structure (and nano-particle) has a width of no more than 2-9 nm, and each resistance-switching memory cell has at least 4-36 of the raised structures. However, other configurations are possible. Generally, it is desirable to have relatively small nanoparticles which are spaced relatively far apart to reduce the number of raised structures per cell. However, both criteria are hard to optimize at the same time. Instead, an optimal tradeoff of size versus spacing can be determined for a particular memory device. The number of raised structure will be dictated by the technology node and the size and spacing of nano particle used. For example, for a 24×24 nm node, with a 6 nm diameter nanodot and 6 nm spacing, there are about four nano particles per cell.

In one approach, less than one-third of a cross-sectional area of the resistance-switching memory cell is consumed by the one or more raised structures (i.e., the values in column 5 of FIG. 5X are less than 0.33). In another approach, less than one-twentieth to one-fifth of a cross-sectional area of the resistance-switching memory cell is consumed by the plurality of electrodes (i.e., the values in column 5 of FIG. 5X are less than 0.05 or 0.20).

Figure 6A:
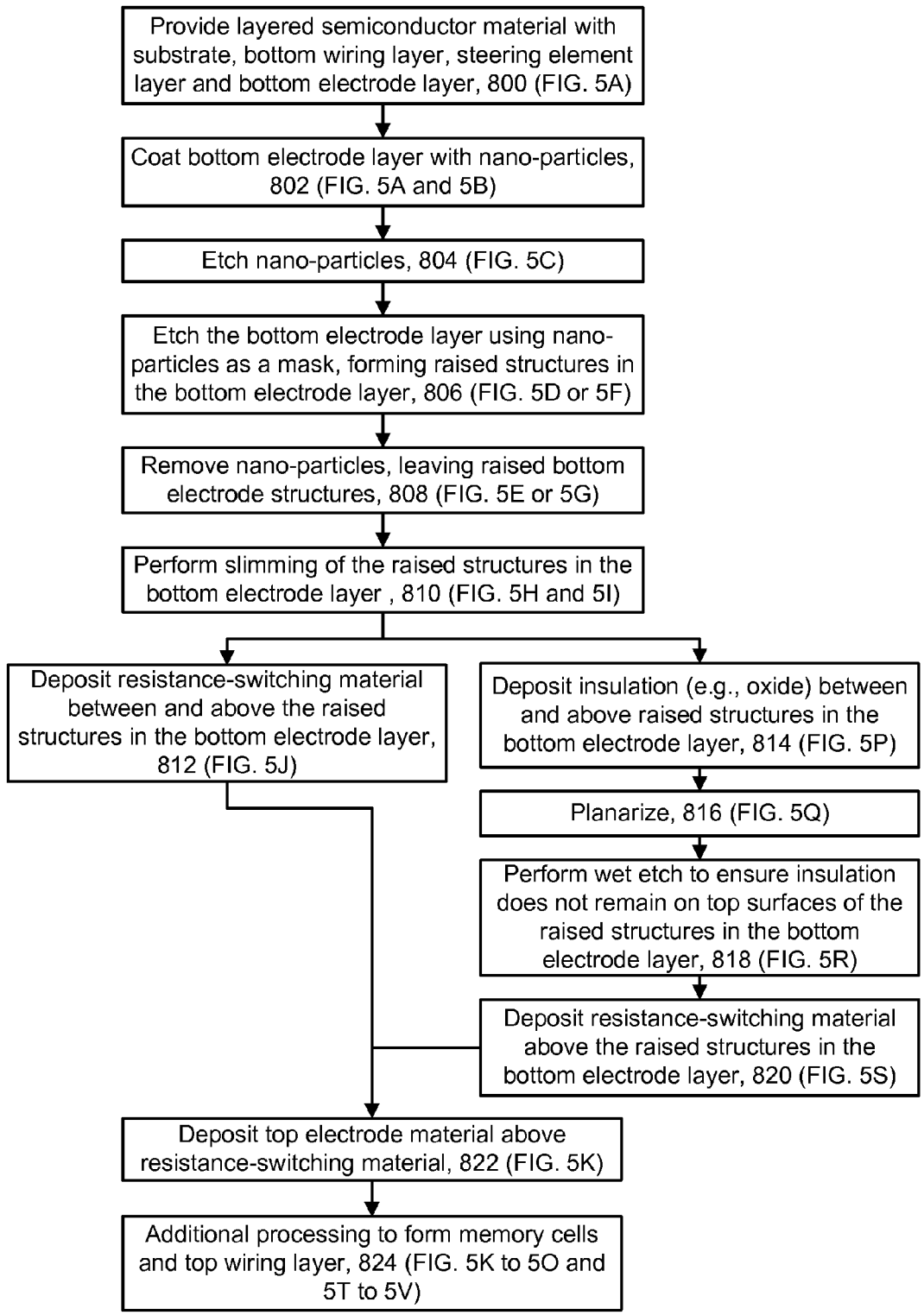
FIG. 6A depicts an example method for fabricating a resistance-switching memory device in accordance with FIGS. 5A-5W.

FIG. 6A depicts an example method for fabricating a resistance-switching memory device in accordance with FIGS. 5A-5W. Step 800 includes providing a layered semiconductor material with a substrate, a bottom wiring layer, a steering element layer and a bottom electrode layer (see, e.g., FIG. 5A). Step 802 includes coating the bottom electrode layer (or a layer above it) with nano-particles (see, e.g., FIGS. 5A and 5B). Step 804 includes etching the nano-particles such as to remove part of the coating, if applicable (see, e.g., FIG. 5C). Step 806 includes etching the bottom electrode layer using the nano-particles as a mask, thereby forming raised structures in the bottom electrode layer (see, e.g., FIG. 5D or 5F). Step 808 includes removing the nano-particles, leaving the raised structures in the bottom electrode layer (see, e.g., FIG. 5E or 5G). Step 810 includes performing slimming of the raised structures in the bottom electrode layer (see, e.g., FIGS. 5H and 5I).

Two alternative branches of the process follow. In a first branch, step 812 includes depositing a resistance-switching material between and above the raised structures in the bottom electrode layer (see, e.g., FIG. 5J). In a second branch, step 814 includes depositing insulation (e.g., oxide) between and above the raised structures in the bottom electrode layer (see, e.g., FIG. 5P). Step 816 includes planarizing the layered semiconductor material (see, e.g., FIG. 5Q). The insulation layer is planarized down to the top surfaces of the raised structures in the bottom electrode layer. Step 818 includes performing a wet etch to ensure that the oxide does not remain on top surfaces of the raised structures in the bottom electrode layer (see, e.g., FIG. 5R). Step 820 includes depositing a resistance-switching material above the raised structures in the bottom electrode layer (see, e.g., FIG. 5S).

Following either the first or second branch, step 822 includes depositing a top electrode material above the resistance-switching material (see, e.g., FIG. 5K or 5S). Step 824 includes performing additional processing to form memory cells and a top wiring layer (see, e.g., FIGS. 5L to 5O and 5T to 5V).

Figure 6B:
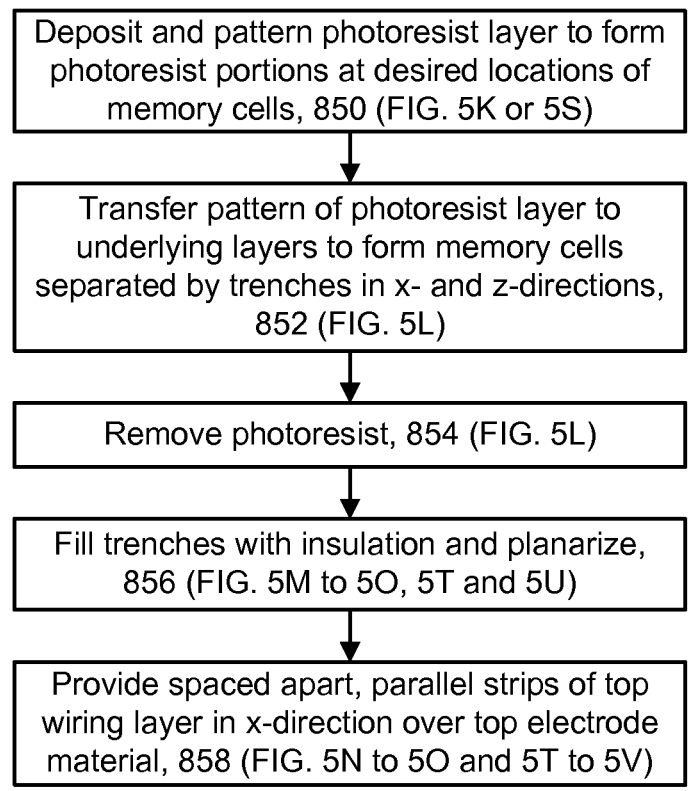
FIG. 6B depicts example details of step 824 of FIG. 6A regarding additional processing to form memory cells and a top wiring layer.

FIG. 6B depicts example details of step 824 of FIG. 6A regarding additional processing to form memory cells and a top wiring layer. Step 850 includes depositing and patterning a photoresist layer (or other mask material) to form photoresist portions at desired locations of memory cells (see, e.g., FIG. 5K or 5S). Step 852 includes transferring a pattern of the photoresist layer to underlying layers to form memory cells separated by trenches in the x- and z-directions (see, e.g., FIG. 5L). Step 854 includes removing the photoresist (see, e.g., FIG. 5L). Step 856 includes filling the trenches with insulation and planarizing (see, e.g., FIGS. 5M to 5O, 5T and 5U). Step 858 includes providing spaced apart, parallel wires of the top wiring layer in the x-direction over the top electrode material (see, e.g., FIGS. 5N to 5O and 5T to 5V).

Accordingly, it can be seem that, in one embodiment, a method for fabricating a resistance-switching memory device comprises: depositing nano-particles on a bottom electrode layer on a substrate; etching the bottom electrode layer using the nano-particles as a mask, the etching results in a plurality of raised structures in the bottom electrode layer; removing the nano-particles; depositing a resistance-switching material, a top of each raised structure is in contact with the resistance-switching material; and forming separate resistance-switching memory cells, each resistance-switching memory cell comprises one or more of the raised structures as a bottom electrode, a portion of the resistance-switching material and a top electrode.

In another embodiment, a method for fabricating a resistance-switching memory device comprises: depositing nano-particles on a bottom electrode layer on a substrate; etching the bottom electrode layer using the nano-particles as a mask, the etching results in a plurality of raised structures in the bottom electrode layer; removing the nano-particles; depositing an insulating material, the insulating material fills voids between the plurality of raised structures, and covers tops of the plurality of raised structures; polishing to remove a portion of the insulating material which is above the tops of the plurality of raised structures; etching to remove a residual of the insulating material which is above the tops of the plurality of raised structures, thereby exposing the tops of the plurality of raised structures while leaving portions of the insulating material in the voids; depositing a resistance-switching layer, a top of each raised structure is in contact with a bottom of the resistance-switching layer; and etching the resistance-switching material and the bottom electrode layer in two orthogonal directions to form a plurality of resistance-switching memory cells, each resistance-switching memory cell comprises one or more of the raised structures as a bottom electrode and a portion of the resistance-switching layer as a resistance-switching material.

In another embodiment, a method for fabricating a resistance-switching memory device comprises: depositing nano-particles on a bottom electrode layer on a substrate; etching the bottom electrode layer using the nano-particles as a mask, the etching results in a plurality of raised structures in the bottom electrode layer; removing the nano-particles; depositing a resistance-switching material, filling voids between the plurality of raised structures and covering tops of the plurality of raised structures; and etching the resistance-switching material and the bottom electrode layer in two orthogonal directions to form a plurality of resistance-switching memory cells, each resistance-switching memory cell comprises one or more of the raised structures as a bottom electrode, a portion of the resistance-switching layer as a resistance-switching material and a top electrode.

In another embodiment, a resistance-switching memory cell comprises: a substrate; one or more raised structures in a bottom electrode layer above the substrate, less than one-third of a cross-sectional area of the resistance-switching memory cell is consumed by the one or more raised structures; a resistance-switching material, a top of each raised structure is in contact with the resistance-switching material; and a top electrode above the resistance-switching material.

In another embodiment, a resistance-switching memory cell comprises: a substrate; a plurality of electrodes above the substrate, each electrode is elongated and vertically extending, less than one-third of a cross-sectional area of the resistance-switching memory cell is consumed by the plurality of electrodes; a resistance-switching material, a top of each raised structure is in electrical contact with a bottom of the resistance-switching material; and a top electrode above the resistance-switching material.

In another embodiment, a resistance-switching memory cell comprises: a substrate; a bottom wiring layer on the substrate comprising spaced apart wires; and a plurality of resistance-switching memory cells formed on the substrate and aligned with the spaced apart wires of the bottom wiring layer, where each resistance-switching memory cell comprising one or more raised structures in a bottom electrode layer above the substrate, less than one-third of a cross-sectional area of the resistance-switching memory cell is consumed by the one or more raised structures, a resistance-switching material, a top of each raised structure is in contact with the resistance-switching material and a top electrode above the resistance-switching material.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for fabricating a resistance-switching memory device, comprising: depositing nano-particles on a bottom electrode layer on a substrate; etching the bottom electrode layer using the nano-particles as a mask, the etching results in a plurality of raised structures in the bottom electrode layer; removing the nano-particles; depositing a resistance-switching material, a top of each raised structure is in contact with the resistance-switching material; and forming separate resistance-switching memory cells, each resistance-switching memory cell comprises more than one of the raised structures as a bottom electrode, a portion of the resistance-switching material and a top electrode.

2. The method of claim 1, wherein:
   each resistance-switching memory cell comprises a plurality of the raised structures as bottom electrodes.

3. The method of claim 1, wherein:
   the forming comprises depositing a top electrode layer and etching the top electrode layer, the resistance-switching material and the bottom electrode layer in two orthogonal directions to form each resistance-switching memory cell as a pillar and to form the top electrodes; and
   spaced apart conductive rails are subsequently deposited as control lines aligned with rows of the pillars and in electrical contact with the top electrodes.

4. The method of claim 1, wherein:
   the forming comprises etching the resistance-switching material and the bottom electrode layer in two orthogonal directions to form each resistance-switching memory cell as a pillar and depositing spaced apart conductive rails aligned with rows of the pillars, the top electrodes are provide by the spaced apart conductive rails.

5. The method of claim 1, wherein:
   the etching of the bottom electrode layer comprises etching to a bottom of the bottom electrode layer so that the plurality of raised structures in the bottom electrode layer are not joined to one another.

6. The method of claim 1, wherein:
   the etching of the bottom electrode layer comprises only partially etching the bottom electrode layer so that the plurality of raised structures are joined to one another at a bottom of the bottom electrode layer.

7. The method of claim 1, wherein:
the depositing of the resistance-switching material causes the resistance-switching material to fill voids between the plurality of raised structures, and to cover tops of the plurality of raised structures.

8. The method of claim 7, wherein:
the resistance-switching material is in a high resistance state when deposited.

9. The method of claim 1, further comprising, before the depositing the resistance-switching material:
depositing an insulating material, the insulating material fills voids between the plurality of raised structures, and covers tops of the plurality of raised structures; and
polishing to remove a portion of the insulating material which is above the tops of the plurality of raised structures; and
etching to remove a residual of the insulating material which is above the tops of the plurality of raised structures, thereby exposing the tops of the plurality of raised structures while leaving portions of the insulating material in the voids.

10. The method of claim 9, wherein:
the resistance-switching material is in a high or low resistance state when deposited.

11. The method of claim 1, further comprising, before the depositing the resistance-switching material:
slimming the plurality of raised structures by forming oxidized surfaces of the plurality of raised structures and removing the oxidized surfaces.

12. The method of claim 1, wherein:
the bottom electrode layer is above a steering element layer;
each resistance-switching memory cell comprises a portion of the steering element layer; and
the portions of the steering element layer are in electrical contact with spaced-apart conductive rails in a bottom wiring layer.

13. The method of claim 1, wherein:
the bottom electrode layer comprises doped polysilicon.

14. The method of claim 1, wherein:
each raised structure has a width of no more than 2-9 nm.

15. The method of claim 1, wherein: less than one-third of a cross-sectional area of each resistance-switching memory cell is consumed by the more than one raised structures of the resistance-switching memory cell.

16. A method for fabricating a resistance-switching memory device, comprising:
depositing nano-particles on a bottom electrode layer on a substrate;
etching the bottom electrode layer using the nano-particles as a mask, the etching results in a plurality of raised structures in the bottom electrode layer;
removing the nano-particles;
depositing an insulating material, the insulating material fills voids between the plurality of raised structures, and covers tops of the plurality of raised structures;
polishing to remove a portion of the insulating material which is above the tops of the plurality of raised structures;
etching to remove a residual of the insulating material which is above the tops of the plurality of raised structures, thereby exposing the tops of the plurality of raised structures while leaving portions of the insulating material in the voids;
depositing a resistance-switching layer, a top of each raised structure is in contact with a bottom of the resistance-switching layer; and
etching the resistance-switching layer and the bottom electrode layer in two orthogonal directions to form a plurality of resistance-switching memory cells, each resistance-switching memory cell comprises one or more of the raised structures as a bottom electrode and a portion of the resistance-switching layer as a resistance-switching material.

17. The method of claim 16, further comprising:
before the etching, depositing a top electrode layer above the resistance-switching layer, the etching comprising etching the top electrode layer, and each resistance-switching memory cell comprises a portion of the top electrode layer as a top electrode.

18. The method of claim 16, wherein:
each resistance-switching memory cell comprises a plurality of the raised structures as bottom electrodes.

19. The method of claim 16, wherein:
less than one-third of a cross-sectional area of each resistance-switching memory cell is consumed by the one or more of the raised structures of the resistance-switching memory cell.

20. A method for fabricating a resistance-switching memory device, comprising:
depositing nano-particles on a bottom electrode layer on a substrate;
etching the bottom electrode layer using the nano-particles as a mask, the etching results in a plurality of raised structures in the bottom electrode layer;
removing the nano-particles;
depositing a resistance-switching material, a top of each raised structure is in contact with the resistance-switching material; and
forming separate resistance-switching memory cells, each resistance-switching memory cell comprises one or more of the raised structures as a bottom electrode, a portion of the resistance-switching material and a top electrode, wherein the nano-particles are coated in a ligand, and the method further comprises etching the ligands after the depositing the nano-particles and before the etching the bottom electrode layer.

* * * * *